(12) United States Patent
Lee et al.

(10) Patent No.: US 7,064,444 B2
(45) Date of Patent: Jun. 20, 2006

(54) MULTI-CHIP BALL GRID ARRAY PACKAGE

(75) Inventors: Jong-Joo Lee, Kyungki-do (KR); Dong-Ho Lee, Kyungki-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/828,792

(22) Filed: Apr. 20, 2004

(65) Prior Publication Data

US 2004/0251529 A1    Dec. 16, 2004

(30) Foreign Application Priority Data

Apr. 26, 2003   (KR) .................... 10-2003-0026581

(51) Int. Cl.
*H01L 23/48*  (2006.01)
*H01L 23/34*  (2006.01)

(52) U.S. Cl. .............. 257/777; 257/723; 257/724; 257/685; 257/924

(58) Field of Classification Search ............... 257/777, 257/723, 724, 685, 686, 924, E23.085; 438/74, 438/109, 244, 253, 396
See application file for complete search history.

(56) References Cited

U.S. PATENT DOCUMENTS

| 3,577,037 | A | * | 5/1971 | Di Pietro et al. ........... 257/621 |
| 5,530,288 | A | * | 6/1996 | Stone ......................... 257/700 |
| 6,730,540 | B1 | * | 5/2004 | Siniaguine ................. 438/107 |
| 6,770,069 | B1 | * | 8/2004 | Hobart et al. .................. 606/9 |
| 6,770,969 | B1 | * | 8/2004 | Mosley ........................ 257/724 |
| 2001/0003375 | A1 | | 6/2001 | Kovats et al. |
| 2002/0030975 | A1 | | 3/2002 | Moon |

FOREIGN PATENT DOCUMENTS

| JP | 11-214448 | 6/1999 |
| JP | 11-177020 | 7/1999 |
| KR | 1020010036329 | 5/2001 |
| KR | 2001-108118 | 12/2001 |
| KR | 1020020043188 | 6/2002 |
| KR | 1020020043435 | 6/2002 |

OTHER PUBLICATIONS

English language abstract of Korea Publication No. 1020010036329.
English language abstract of Korea Publication No. 1020020043188.
English language abstract of Korea Publication No. 1020020043435.
English language abstract of Japanese Publication No. 11-214448.
English language abstract of Japanese Publication No. 11-177020.
English language abstract of Korean Publication No. 2001-108118.

* cited by examiner

*Primary Examiner*—Jasmine Clark
(74) *Attorney, Agent, or Firm*—Marger Johnson & McCollom, P.C.

(57) ABSTRACT

A multi-chip BGA package has two or more rerouted chips, each of which has one or more electrode plates. The electrode plate is coplanar with rerouting lines on the rerouted chip and may act as a decoupling capacitor, reducing simultaneous switching noise from fluctuations in power voltage, without causing an increase in thickness of the package. Further, each pair of rerouting lines on upper and lower rerouted chips includes two or more interconnection bumps. This reduces inductance and resistance of electric signal propagation. Therefore, the multi-chip BGA package of this invention can realize small, thin, high-speed and high-density memory devices.

34 Claims, 20 Drawing Sheets

MULTI-CHIP BALL GRID ARRAY PACKAGE

CROSS REFERENCE TO RELATED APPLICATIONS

This U.S. non-provisional application claims priority under 35 U.S.C. § 119 to Korean Patent Application No. 2003-26581 filed Apr. 26, 2003, the contents of which are incorporated by reference.

BACKGROUND OF THE INVENTION

1. Field of the Invention

The present invention relates generally to a multi-chip package with ball grid array (BGA), and more particularly, to a multi-chip BGA package with improved rerouting configuration for better signal propagation and decoupling capacitors for reduced switching noise.

2. Description of the Related Art

Multi-chip packaging involves mounting two or more chips on a lead frame or a circuit board. specifically, a BGA multi-chip package employs conductive balls arranged to provide electrical connections with external electronics.

FIG. 1 shows an exemplary conventional multi-chip BGA package. Referring to FIG. 1, the multi-chip BGA package M1 includes lower and upper rerouted chips 10 and 20, interconnection bumps 5, a substrate 1, conductive balls 2, bonding wires 3, and an encapsulant 4.

The lower and upper rerouted chips 10 and 20 are spaced apart with active surfaces facing each other. Each rerouted chip 10 and 20 has a semiconductor chip 11 and 21, a first insulating layer 13 and 23, rerouting lines 14 and 24, and a second insulating layer 17 and 27.

Each semiconductor chip 11 and 21 is a center pad type. That is, chip pads 12 and 22 are arranged in a row along central lines on the active surface of each chip 11 and 21. The chip pads 12 and 22 protrude through a passivation layer (not shown) covering the active surface and made chiefly of silicon nitride.

The first insulating layer 13 and 23 of each rerouted chip 10 and 20 is on a passivation layer, exposing chip pads 12 and 22. The rerouting lines 14 and 24, also called redistribution lines, are formed on the first insulating layer 13 and 23 and electrically connect with respective chip pads 12 and 22. The rerouting lines 14 and 24 extend perpendicular to a row of the chip pads 12 and 22 and alternately reach opposing edges of the chip. The second insulating layer 17 and 27 covers both the first insulating layer 13 and 23 and the rerouting lines 14 and 24, exposing bump pads 15 and 25 which are integrated in the rerouting lines 14 and 24. The second insulating layer 17 of the lower chip 10 exposes bond pads 16.

Each interconnection bump 5 resides between corresponding lower and upper bump pads 15 and 25 and electrically connects the corresponding lower and upper rerouting lines 14 and 24.

The top surface of substrate 1 attaches to the back surface of lower chip 10 by adhesion. Conductive balls 2 arrange across the bottom surface of substrate 1 and electrically connect the package M1 to external electronics.

Bonding wires 3 electrically connect bond pads 16 of lower chip 10 to substrate 1. The encapsulant 4 provides the top surface of substrate 1 and covers the chips 10 and 20 and bonding wires 3.

The above-described conventional multi-chip BGA package 1 has drawbacks. For example, an increase in switching speed of the rerouted chip causes simultaneous switching noise due to fluctuation in chip power voltage. This often decreases chip speed, increases noise-like fluctuation and time distortion, as well as increasing other operation errors. Furthermore, when connecting a cable shield to a ground line, common-mode radiation occurs and serious electromagnetic interference (EMI) follows. Additionally, complicated interconnection schemes in conventional multi-chip BGA packages increase parasitic inductance and deteriorate electric signal propagation.

SUMMARY OF THE INVENTION

It is therefore an object of the present invention to provide a multi-chip BGA package that reduces switching noise, improves signal propagation, and generally improves electronic characteristics.

In one embodiment of the present invention, a multi-chip BGA package comprises first and second rerouted chips. The first rerouted chip includes a first semiconductor chip, first rerouting lines, and a first electrode plate. Additionally, it has first chip pads composed of first power chip pads and first ground chip pads. The first rerouting lines electrically connect to the first chip pads. The first electrode plate on the first semiconductor chip electrically connects to the first power chip pads or the first ground chip pads.

The second rerouted chip, which faces the first rerouted chip, includes a second semiconductor chip, second rerouting lines, and a second electrode plate. Additionally, it has second chip pads composed of second power chip pads electrically connected to the first power chip pads and second ground chip pads electrically connected to the first ground chip pads. The second rerouting lines electrically connect to the second chip pads. The second electrode plate on the second semiconductor chip electrically connects to the second power chip pads or the second ground chip pads.

In particular, when the first electrode plate connects to the first power chip pads, the second electrode plate connects to the second ground chip pads, alternatively, when the first electrode plate connects to the first ground chip pads, the second electrode plate connects to the second power chip pads.

The multi-chip BGA package further comprises a plurality of first interconnection bumps, a substrate, a plurality of bonding wires, and a plurality of conductive balls. The first interconnection bumps interpose and electrically connect the first rerouting lines and the second rerouting lines. The substrate supports the first rerouted chip. The bonding wires electrically connect the first rerouting lines with the substrate. The conductive balls are arranged under the substrate and also electrically connect the substrate to external electronics.

In another embodiment, the first rerouted chip may further include a first insulating layer on the first semiconductor chip, buttressing the first electrode plate. The first insulating layer may have first openings through which the first electrode plate communicates with the first power chip pads or the first ground chip pads. Moreover, the first electrode plate may be coplanar with the first rerouting lines and may have first slots, which may contain the first rerouting lines. In particular, the first rerouting lines may have a coplanar waveguide capable of impedance control according to a ratio of a width of the first rerouting line to a width of the first slot.

In still another embodiment, the second rerouted chip may further include a second insulating layer on the second semiconductor chip, buttressing the second electrode plate. The second insulating layer may have second openings through which the second electrode plate communicates with the second power chip pads or the second ground chip pads. Moreover, the second electrode plate may be coplanar with the second rerouting lines and may have second slots, which may contain the second rerouting lines. In particular, the second rerouting lines may have a coplanar waveguide capable of impedance control according to a ratio of a width of the second rerouting line to a width of the second slot.

In one embodiment, the first rerouted chip may include a third electrode plate, disposed opposite to the second electrode plate, with respect to the first electrode plate, and electrically connecting to the first power chip pads or the first ground chip pads. When the first electrode plate connects to the first power chip pads, the third electrode plate connects to the first ground chip pads, and alternatively when the first electrode plate connects to the first ground chip pads, the third electrode plate connects to the first power chip pads.

In another embodiment, the second rerouted chip may include a fourth electrode plate disposed opposite to the first electrode plate with respect to the second electrode plate. Furthermore, the fourth electrode plate may be electrically connected to the second power chip pads or the second ground chip pads. When the second electrode plate connects to the second power chip pads, the fourth electrode plate connects to the second ground chip pads, alternatively, when the second electrode plate connects to the second ground chip pads, the fourth electrode plate connects to the second power chip pads.

In another embodiment, a multi-chip BGA package may comprise a plurality of second interconnection bumps between and electrically connecting the first rerouting lines and the second rerouting lines, and which are spaced adjacent from the first interconnection bumps.

In one embodiment a multi-chip BGA package comprises a first rerouted chip, a second rerouted chip, a plurality of first interconnection bumps, a plurality of second interconnection bumps, a substrate, a plurality of bonding wires, and a plurality of conductive balls.

The first rerouted chip includes a first semiconductor chip having first chip pads. It also has first rerouting lines electrically connected to the first chip pads. Each of the first rerouting lines has a first bump pad, a third bump pad, and a bond pad. The second rerouted chip, facing the first rerouted chip, includes a second semiconductor chip having second chip pads, likewise, the second semiconductor chip has second rerouting lines electrically connected to the second chip pads. Each of the second rerouting lines has a second bump pad and a fourth bump pad.

The first interconnection bumps electrically connect the first and second bump pads. Likewise, the second interconnection bumps electrically connect the third and fourth bump pads. The substrate buttresses the first rerouted chip. Bonding wires on the respective bond pads electrically connect the first rerouting lines with the substrate. The arrangement of the conductive balls electrically connects the substrate to external electronics.

In one embodiment, a multi-chip BGA package may further comprise a plurality of dummy balls between the first and second rerouted chips.

DETAILED DESCRIPTION OF THE INVENTION

Embodiments of the present invention are described more fully with reference to the accompanying drawings. This description is intended only to illustrate and not limit embodiments of the invention. Rather, these embodiments provide disclosure.

In the description, well-known structures and processes have not been shown in detail to avoid obscuring the present invention. It will be appreciated that for simplicity and clarity of illustration, some elements illustrated in the figures have not necessarily been drawn to scale. For example, the dimensions of some of the elements are exaggerated relative to other elements for clarity. Like numerals are used for like and corresponding parts of the various drawings.

First Embodiment

Figure 2:
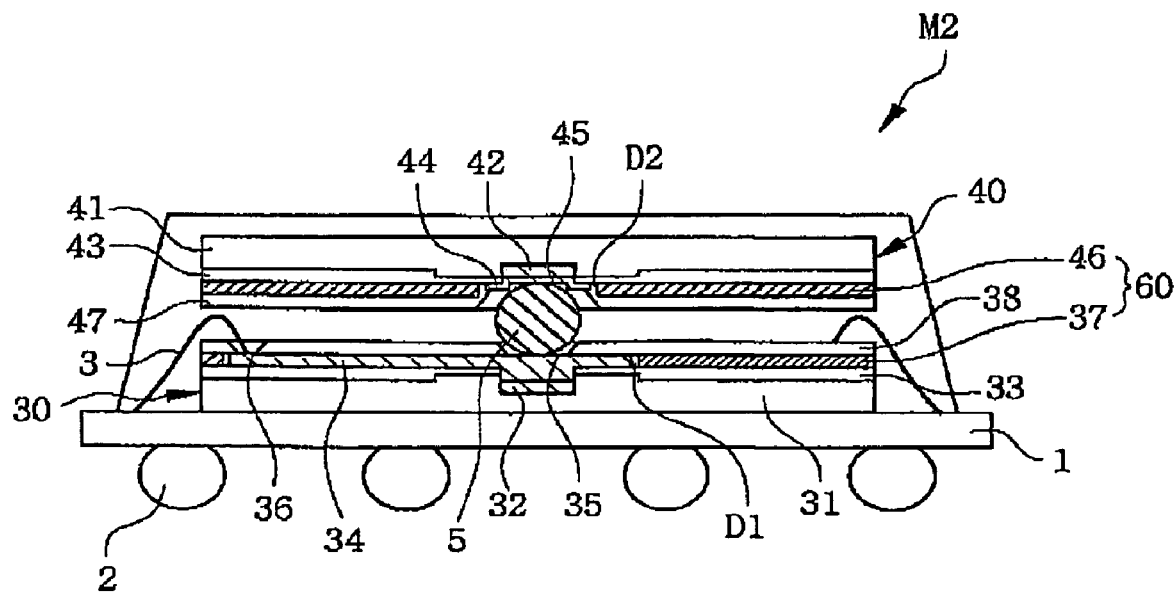
FIG. 2 is a cross-sectional view of a multi-chip BGA package in accordance with a first embodiment of the present invention.

FIG. 2 schematically shows, in a cross-sectional view, a multi-chip BGA package M2 in accordance with a first embodiment of the present invention. As shown in FIG. 2, the multi-chip BGA package M2 includes first and second rerouted chips 30 and 40, first interconnection bump 5, a substrate 1, conductive balls 2, bonding wires 3, and an encapsulant 4.

Active surfaces of the first and second rerouted chips 30 and 40 face each other in a spaced arrangement.

The first rerouted chip 30 has a first semiconductor chip 31, a first insulating layer 33, first rerouting lines 34, a first electrode plate 37, and a second insulating layer 38.

The first semiconductor chip 31 is a center pad type. Specifically, the active surface of the first semiconductor chip 31 contains first chip pads 32 arranged centrally in a row. The first chip pads 32 protrude through a passivation layer (not shown) covering the active surface and made chiefly of silicon nitride. The first chip pads 32 are made mainly of aluminum.

The first rerouted chip 30 is fabricated as follows.

A well known wafer fabrication process provides the first semiconductor chip 31 containing first chip pads 32.

The fabrication process then forms the first insulating layer 33 on the first semiconductor chip 31, exposing the first chip pads 32. Specifically, to form the first insulating layer 33, liquid insulating material coats the passivation layer to a given thickness, then pre-cures at a given temperature. Patterning of the pre-cured insulating material exposes the first chip pads 32, before the material undergoes a post-curing process.

Next, the fabrication process entails forming a first under bump metal (UBM) layer (not shown) on the first insulating layer 33 and the first chip pads 32 by a sputtering process. The UBM layer generally comprises one or more metals, such as chromium (Cr), titanium (Ti), copper (Cu), and so forth, for enhancing adhesion and preventing diffusion.

Next, a plating process forms the first rerouting lines 34, or redistribution lines, and the first electrode plate 37 on the first UBM layer. For plating, a plating resist coats the first UBM layer, then patterned by ultraviolet rays or laser. Metal such as copper (Cu) or nickel (Ni) then plates the resist pattern, so that the first rerouting lines 34 and the first electrode plate 37 are simultaneously produced with a desired pattern. Particularly, the first rerouting lines 34 and the first electrode plate 37 have a gap as indicated by reference character 'D1' in FIG. 2. This step may add another UBM layer on the first rerouting lines 34 and the first electrode plate 37 to increase adhesion strength with the first interconnection bumps 5 and the bonding wires 3, which will be described later.

Figure 3A:
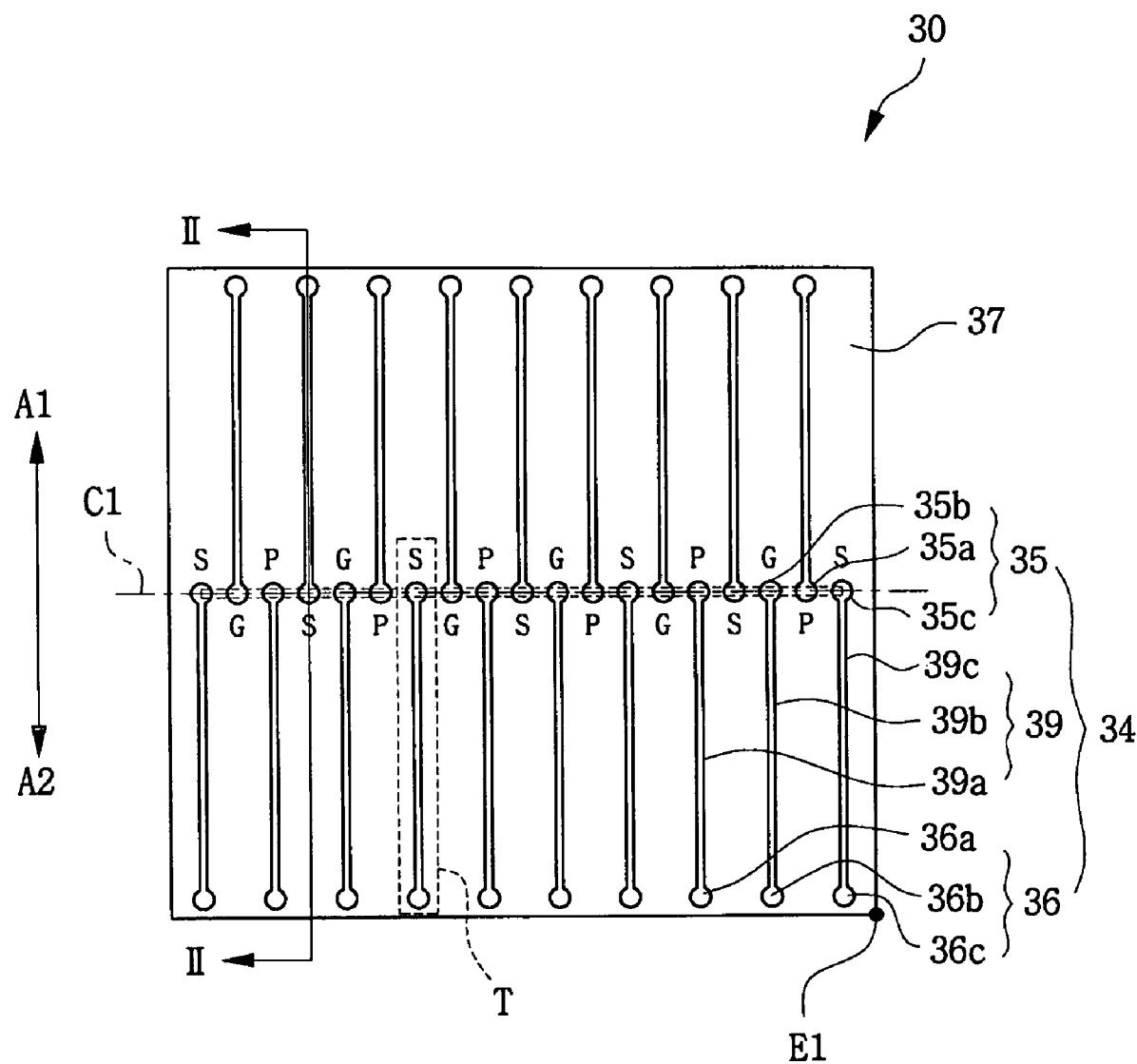
FIG. 3A is a plan view of a first rerouted chip of a multi-chip BGA package in accordance with a first embodiment of the present invention.

Next, an etching process partially removes the first UBM layer. After plating and removal of the plating resist, the process entails etching the first UBM layer by using both the rerouting lines 34 and the electrode plate 37 as a mask. After etching, the first rerouting lines 34 connect to the corresponding first chip pads 32 through the first UBM layer. Also, the first electrode plate 37 connects to ground chip pads among the first chip pads 32. FIG. 3A will describe this in detail.

The resultant structure may comprise the second insulating layer 38. Specifically, to form the second insulating layer 38, liquid insulating material coats the first rerouting lines 34 and the first electrode plate 37, then undergoes a pre-cure. The pre-cured insulating material is then patterned to create openings exposing first bump pads 35 and first bond pads 36. These exposed parts of the first rerouting lines 34 then undergo a post-curing process.

On the other hand, the second rerouted chip 40 has a second semiconductor chip 41, a third insulating layer 43, second bump pads 45, a second electrode plate 46, and a fourth insulating layer 47.

The second semiconductor chip 41 is a center pad type. Specifically, the active surface of the second semiconductor chip 41 contains second chip pads 42 arranged centrally in a row. The second chip pads 42 protrude through a passivation layer (not shown) covering the active surface and made chiefly of silicon nitride. The second chip pads 42 are made mainly of aluminum.

The second rerouted chip 40 is fabricated as follows.

A well known wafer fabrication process provides the second semiconductor chip 41 containing second chip pads 42.

The fabrication process then forms the third insulating layer 43 on the second semiconductor chip 41. Specifically, to form the third insulating layer 43, liquid insulating material coats the passivation layer to a given thickness, then pre-cures at a given temperature. Patterning of the pre-cured insulating material exposes the second chip pads 42, before the material undergoes a post-curing process.

Next, the fabrication process entails forming a first second UBM layer (not shown) on the third insulating layer 43 and the second chip pads 42 by a sputtering process.

Next, a plating process forms the second bump pads 45 and the second electrode plate 46 on the second UBM layer. For plating, a plating resist coats the second UBM layer, then patterned. Metal such as copper (Cu) or nickel (Ni) then plates the resist pattern, so that the second bump pads 45 and the second electrode plate 46 are simultaneously produced with a desired pattern. This step may add another UBM layer to increase adhesion strength with the first interconnection bumps 5, which will be described later.

Figure 3B:
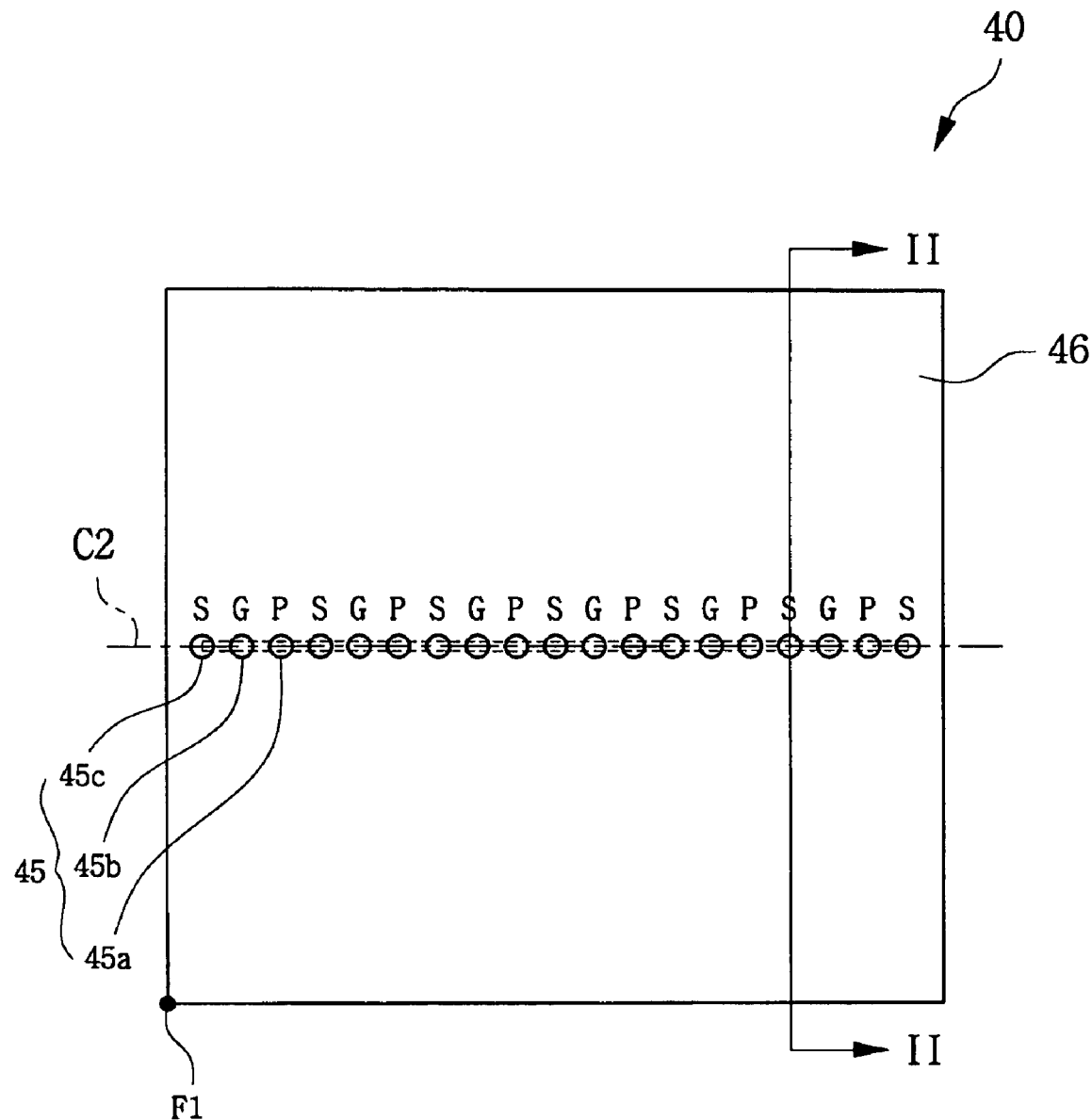
FIG. 3B is a plan view of a second rerouted chip of a multi-chip BGA package in accordance with a first embodiment of the present invention.

Next, an etching process partially removes the second UBM layer. After plating and removal of the plating resist, the process entails etching the second UBM layer by using both the second bump pads 45 and the second electrode plate 46 as a mask. After etching, the second bump pads 45 connect to the corresponding second chip pads 42 through the second UBM layer. Also, the second electrode plate 46 connects to power chip pads among the second chip pads 42. FIG. 3B will describe this in detail. Particularly, the second bump pads 45 and the second electrode plate 46 are separated as indicated by reference character 'D2' in FIG. 2.

The resultant structure may comprise the fourth insulating layer 47. Specifically, to form the fourth insulating layer 47, liquid insulating material coats the second bump pads 45 and the second electrode plate 46, then undergoes a pre-cure. The pre-cured insulating material is then patterned to create openings exposing second bump pads 45 and then undergo a post-curing process.

The first interconnection bump 5 electrically connects the corresponding first and second bump pads 35 and 45.

Adhesion secures the top surface of substrate 1 to the adjacent back surface of the first rerouted chip 30. The conductive balls 2 may electrically connect the package M2 to external electronics by a arranging them on the bottom surface of substrate 1.

The bonding wires 3 electrically connect the first bond pads 36 of the first rerouted chip 30 to substrate 1. The encapsulant 4 forms on the top surface of substrate 1 and covers the first and second rerouted chips 30 and 40 and the bonding wires 3.

Figure 3C:
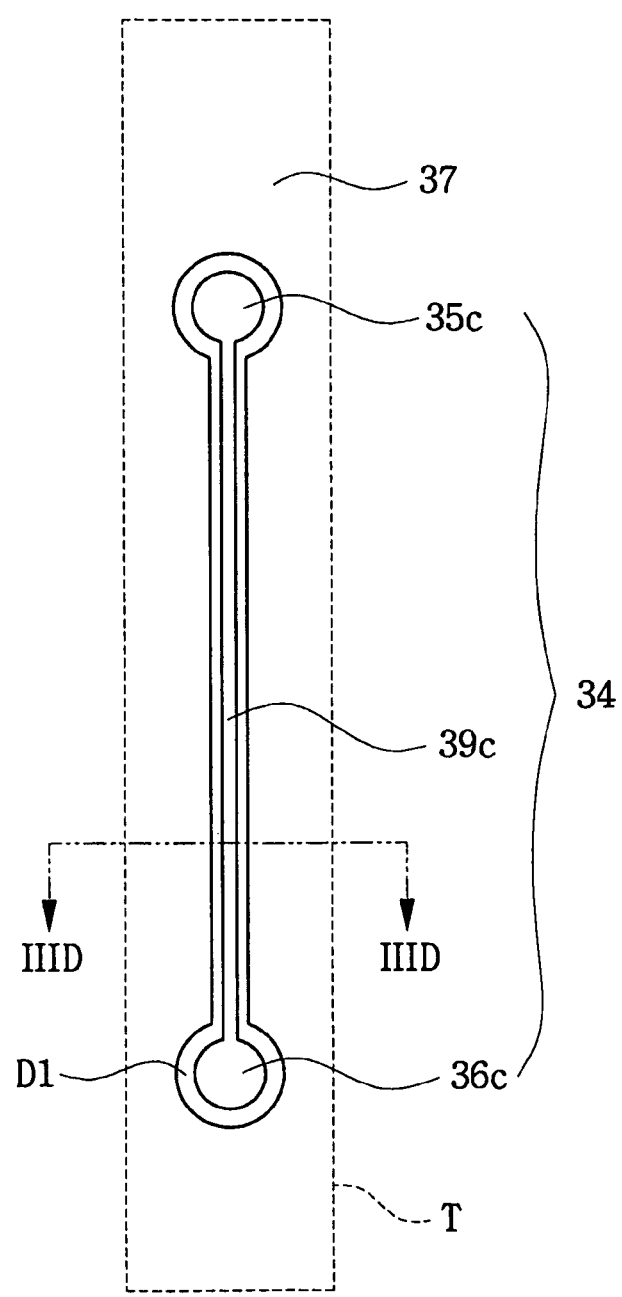
FIG. 3C is an enlarged plan view of the part 'T' of FIG. 3A.
Figure 3D:
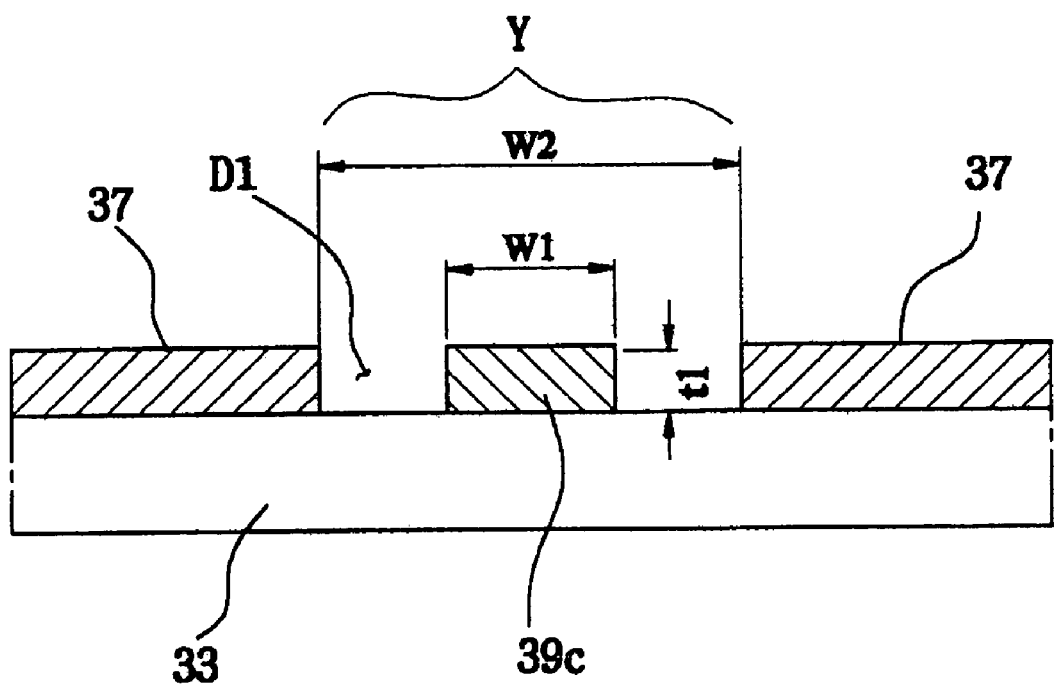
FIG. 3D is a cross-sectional view taken along the line IIID—IIID of FIG. 3C.

FIG. 3A schematically shows, in a plan view, a rerouting configuration on the first rerouted chip 30 shown in FIG. 2, and FIG. 3B schematically shows a rerouting configuration on the second rerouted chip 40 shown in FIG. 2. FIG. 2 corresponds to a cross-sectional view taken along the line II—II of FIGS. 3A and 3B. Further, FIG. 3C is an enlarged plan view of the part 'T' of FIG. 3A, and FIG. 3D is a cross-sectional view taken along the line IIID—IIID of FIG. 3C.

In FIGS. 3A and 3B, reference characters 'P', 'G' and 'S' mean a power supply line (Vdd), ground line (Vss) and signal line, respectively. This will applies to following figures as well.

As illustrated in FIG. 3A, the first rerouted chip 30 includes first rerouting lines 34 and first electrode plate 37. The first rerouting lines 34 and the first electrode plate 37 are separated from each other. The separating space D1 is not shown in FIG. 3A for simplicity and clarity of illustration, but best shown in FIGS. 3C and 3D. Omission of the separating space in the following figures is for clarity only, and each embodiment may comprise it.

Each of the first rerouting lines 34 comprises a first bump pad 35, first bond pad 36, and first connection line 39.

The first bump pads 35 are arranged in a row parallel to a central line C1 and electrically connect with corresponding first chip pads 32 shown in FIG. 2. The first bump pads 35 include first power bump pads 35a, first ground bump pads 35b, and first signal bump pads 35c.

First power bump pad 35a electrically connects with the first power chip pad (not shown) and an external power terminal (not shown). Similarly, the first ground bump pad 35b electrically connects with the first ground chip pad (not shown) and external ground terminal (not shown). Likewise, the first signal bump pad 35c electrically connects with the first signal chip pad (not shown) and external signal terminal (not shown).

In this embodiment, first power bump pads 35a, first ground bump pads 35b, and first signal bump pads 35c are divided on an equal ratio for convenience, however such a ratio may vary, for example, according to semiconductor chip type. Also, their arrangement may vary according to semiconductor chip types.

Bonding wire 3 electrically and physically bonds to each of the first bond pads 36, shown in FIG. 2. First bond pads 36 disperse along both opposing edges on the first rerouted chip 30, namely, near end portions in directions of A1 and A2 in FIG. 3A. The first bond pads 36 include first power bond pads 36a, first ground bond pads 36b, and first signal bond pads 36c.

The first connection lines 39 include first power connection lines 39a, first ground connection lines 39b, and first signal connection lines 39c. Each of the first power connection lines 39a connects the first power bump pad 35a and the first power bond pad 36a. Similarly, each of the first ground connection lines 39b connects the first ground bump pad 35b and the first ground bond pad 36b. Likewise, each of the first signal connection lines 39c connects the first signal bump pad 35c and the first signal bond pad 36c.

Particularly, the first electrode plate 37 electrically connects with the first ground bump pads 35b, and therefore is in electrical isolation from first power bump pads 35a and first signal bump pads 35c. Suitable patterning of the plating resist in the above-described step simultaneously forms the first rerouting lines 34 and the first electrode plate 37, making this configuration possible. Consequently, the first electrode plate 37 acts as a ground plate. The first electrode plate 37 may desirably be formed in one united body with the first ground bump pads 35b, the first ground bond pads 36b, and the first ground connection lines 39b. Therefore, the first bump 5, shown in FIG. 2 and mounted on the first ground bump pad 35b, electrically communicates with the first electrode plate 37.

Referring to FIG. 3B, the second rerouted chip 40 includes the second bump pads 45 and the second electrode plate 46. The second bump pads 45 connect with the respective corresponding first bumps 5 shown in FIG. 2. Therefore, each first bump 5 provides an electrical path between the first and second bump pads 35 and 45.

By arranging the second bump pads 45 in a row parallel to a central line C2, they can electrically connect to the respective corresponding second chip pad 42 shown in FIG. 2. The second bump pads 45 include second power bump pads 45a, second ground bump pads 45b, and second signal bump pads 45c, each of which electrically connects to the corresponding first power bump pads 35a, the second ground bump pads 35b, and the second signal bump pads 35c, discussed above with reference to FIG. 3A. In FIGS. 3A and 3B, a corner E1 of the first rerouted chip 30 meets a corner F1 of the second rerouted chip 40.

The second power bump pad 45a electrically connects with the second power chip pad (not shown) and external power terminal (not shown). Similarly, the second ground bump pad 45b electrically connects with the second ground chip pad (not shown) and external ground terminal (not shown). Similarly, the second signal bump pad 45c electrically connects with the second signal chip pad (not shown) and external signal terminal (not shown).

The second electrode plate 46 electrically connects with the second power bump pads 45a, and is in electrical isolation from both the second ground bump pads 45b and the second signal bump pads 45c. Therefore, when forming the second electrode plate 46 and the second bump pads 45, the plating resist pattern should provide electrical connections between the second electrode plate 46 and the second power bump pads 45a. Consequently, the second electrode plate 46 acts as a power plate. The second electrode plate 46 may desirably be formed in one united body with the second power bump pads 45a. Therefore, the first bump 5, shown in FIG. 2 and joined to the second power bump pad 45b, electrically communicates with the second electrode plate 46.

FIG. 3C is an enlarged plan view of the part 'T' of FIG. 3A. Referring to FIG. 3C, space D1 separates the first rerouting line 34 and the first electrode plate 37, electrically isolating them. FIG. 3C illustrates signal lines indicated by annexed small letters 'c'. One of either power lines or ground lines also separate from the first electrode plate 37.

Therefore, the other line electrically couples to the electrode plate so as to act as a power plate or a ground plate.

FIG. 3D is a cross-sectional view taken along the line IIID—IIID of FIG. 3C. Referring to FIG. 3D, the first signal connection line 39c forms on the same plane as the first electrode plate 37. Also, the first signal connection line 39c is within a slot, indicated by a reference letter 'Y', of the first electrode plate 37. Therefore, the first signal connection line 39c becomes a coplanar waveguide (CPW). That is, regardless of thickness (t1) of the first signal connection line 39c, impedance of the signal connection line 39c can vary according to the ratio of a width (w1) of the signal connection line 39c to a width (w2) of the slot. Therefore, impedance control of the signal connection line 39c is possible by suitably establishing the width ratio in a design of the package. This can effectively improve the signal propagation property.

Returning to FIG. 2, the first and second electrode plates 37 and 46 form a capacitor 60. In one embodiment they form a decoupling capacitor 60. The decoupling capacitor 60 reduces simultaneous switching noise due to voltage fluctuation generated in the power and ground lines. Therefore, the present invention improves power delivery characteristics of the rerouted chips, while additionally fostering system operational stability. Furthermore, the present invention diminishes electromagnetic waves due to simultaneous switching noise.

Moreover, the first electrode plate 37 is coplanar with the first rerouting lines 34 and also the second electrode plate 46 is coplanar with the second bump pads 45, minimizing effects on the thickness of the package from the decoupling capacitor. Therefore, a thin multi-chip BGA package is possible in spite of using the decoupling capacitors.

The first to fourth insulating layers 33, 38, 43 and 47 use preferably dielectric material. Instead of the second and fourth insulating layers 38 and 47, one dielectric layer may interpose the first and second electrode plates 37 and 46. Preferably, the dielectric layer has a high dielectric constant, such as tantalum pentoxide (Ta2O5), and a relatively small thickness so as to improve the quality of a decoupling capacitor.

Additionally, to prevent bending and enhance adhering to the insulating layers, the first and second electrode plates 37 and 46 may have a surface that has protruding parts preferably in a mesh-like arrangement.

The first electrode plate 37 should occupy nearly the whole area on the first rerouted chip 30 , except the first rerouting lines 34, to improve the quality of a decoupling capacitor. Similarly, the second electrode plate 46 should occupy nearly the whole area on the second rerouted chip 40, except the second bump pads 45.

On the other hand, contrary to the above-description, the first electrode plate 37 may electrically connect with the first power bump pads 35a and be in electrical isolation from the first ground bump pads 35b and the first signal bump pads 35c. Likewise, the second electrode plate 46 may electrically connect with the second ground bump pads 45b and be in electrical isolation from the second power bump pads 45a and the second signal bump pads 45c. Therefore ordering the electrode plates 37 and 46 above the substrate in the following manner: first the substrate, ground plate, then power plate, or alternatively, the substrate, power plate, then ground plate.

Preferably, the multi-chip BGA package M2 of the present invention has a same-die stack structure by employing the first and second semiconductor chip 31 and 41 of similar type and size.

Second Embodiment

Figure 4:
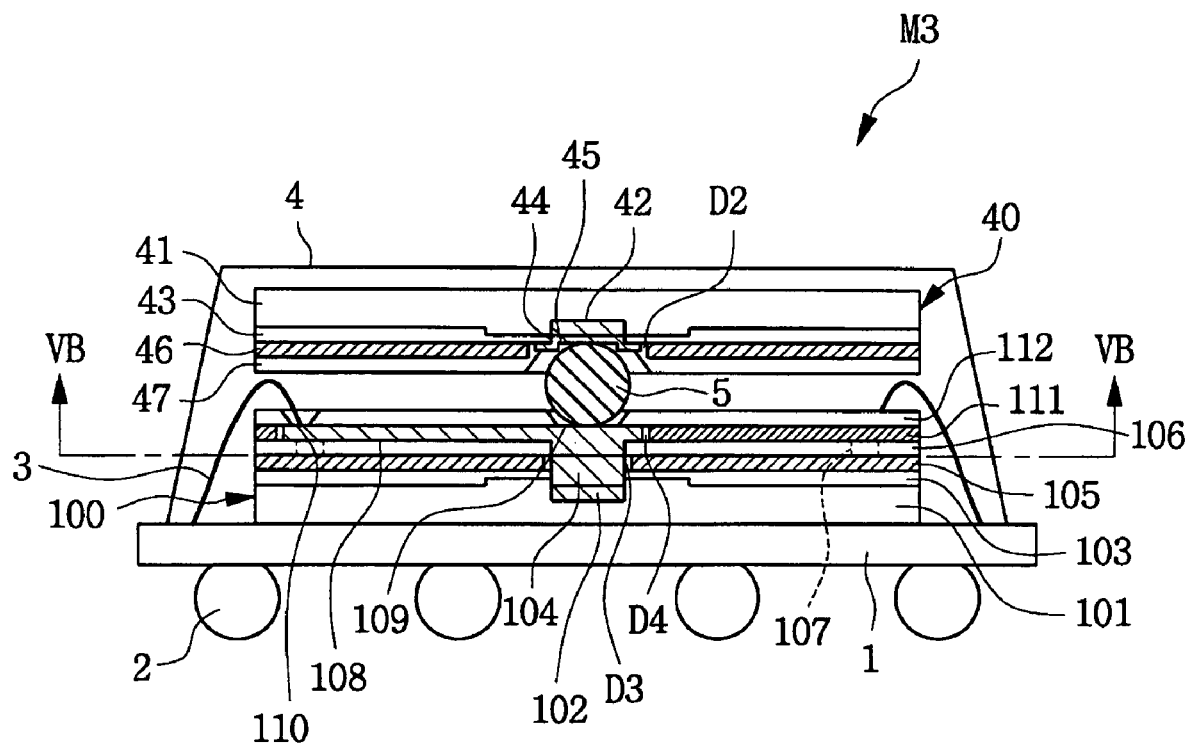
FIG. 4 is a cross-sectional view of a multi-chip BGA package in accordance with the second embodiment of the present invention.

FIG. 4 schematically shows, in a cross-sectional view, a multi-chip BGA package M3 in accordance with a second embodiment of the present invention. The following description will not detail elements described previously, and will use the same reference numerals.

As shown in FIG. 4, the multi-chip BGA package M3 of this embodiment includes twentieth and third rerouted chips 40 and 100, the first interconnection bumps 5, the substrate 1, the conductive balls 2, the bonding wires 3, and the encapsulant 4.

The first interconnection bumps 5, the substrate 1, the conductive balls 2, the bonding wires 3, and the encapsulant 4 are substantially the same as described before in the first embodiment, respectively, so detailed descriptions about them are omitted. Furthermore, the twentieth rerouted chip 40 is similar to the aforementioned second rerouted chip, except that the second electrode plate 46 electrically connects with the ground pads of the second chip pads 42 and thereby acts as a ground plate.

The third rerouted chip 100 includes a third semiconductor chip 101, a fifth insulating layer 103, first linking spots 104, a third electrode plate 105, a sixth insulating layer 106, second linking spots 107, second rerouting lines 108, a fourth electrode plate 111, and a seventh insulating layer 112.

The third semiconductor chip 101, a center pad type, arranges third chip pads 102 along central lines of its active surface. The third chip pads 102 protrude through a passivation layer (not shown) covering the active surface and made chiefly of silicon nitride. In one embodiment the third chip pads 102 are made mainly of aluminum.

The third rerouted chip 100 is fabricated as follows.

A well known wafer fabrication process provides the third semiconductor chip 101 containing third chip pads 102.

Next, fifth insulating layer 103 and third UBM layer (not shown) are successively formed on the third semiconductor chip 101. These process steps are similar to those in the first embodiment.

The process then involves forming the first linking spots 104 and the third electrode plate 105 on the third UBM layer by coating and patterning a plating resist, and plating copper (Cu) or nickel (Ni) within the resist pattern.

The process then entails removing the patterned plating resist, and partially removing the third UBM layer by an etching process using both the first linking spots 104 and the third electrode plate 105 as a mask. After etching, the first linking spots 104 electrically connects with the corresponding third chip pads 102 through the third UBM layer. Also, the third electrode plate 105 electrically connects with the ground pads of the third chip pads 102. This will be described later in detail with reference to FIG. 5B. The first linking spots 104 and the third electrode plate 107 are separated as indicated by reference character 'D3'.

Formation of the sixth insulating layer 106 follows. Specifically, to form the sixth insulating layer 106, liquid insulating material coats the first linking spots 104 and the third electrode plate 105 to a given thickness and pre-cures at a given temperature. Patterning of the pre-cured insulating material exposes the first linking spots 104 and also provides spaces for the second linking spots 107, before the material undergoes a post-curing process.

Next, the fabrication process entails forming second linking spots 107 in spaces on the sixth insulating layer 106 by plating copper (Cu) or nickel (Ni). However, for example, if the third electrode plate 105 electrically connects with the ground linking spots of the first linking spots 104, the formation of the second linking spots 107 may be omitted.

Next, the process entails forming a fourth UBM layer (not shown) on the resultant structure, including the first linking spots 104, sixth insulating layer 106, and second linking spots 107 by using a sputtering process.

Next, a plating process forms the second rerouting lines 108 and the fourth electrode plate 111 on the fourth UBM layer. For plating, a suitable plating resist coats and patterns on the fourth UBM layer. Thereafter, by plating copper (Cu) or nickel (Ni) within the resist pattern, the second rerouting lines 108 and the fourth electrode plate 111 form in a desired pattern. In this step, an additional UBM layer may increase adhesion strength with the first interconnection bumps 5 and the bonding wires 3.

The process then involves removing the patterned plating resist, and partially removing the fourth UBM layer by an etching process using both the second rerouting lines 108 and the fourth electrode plate 111 as a mask. After etching, the second rerouting lines 108 electrically connect with the respective corresponding first linking spots 104 through the fourth UBM layer. Also, the fourth electrode plate 111 electrically connects with power chip pads among the third chip pads 102. This will be described later in detail with reference to FIG. 5A. Reference character 'D4' indicates separation of the second rerouting lines 108 and the fourth electrode plate 111.

The resultant structure may comprise the seventh insulating layer 112. Specifically, to form the seventh insulating layer 112, liquid insulating material coats the second rerouting lines 108 and the fourth electrode plate 111, then undergoes a pre-cure. The pre-cured insulating material is then patterned to create openings exposing third bump pads 109 and second bond pads 110, These exposed parts of the second rerouting lines 108 then undergo a post-curing process.

Figure 5A:
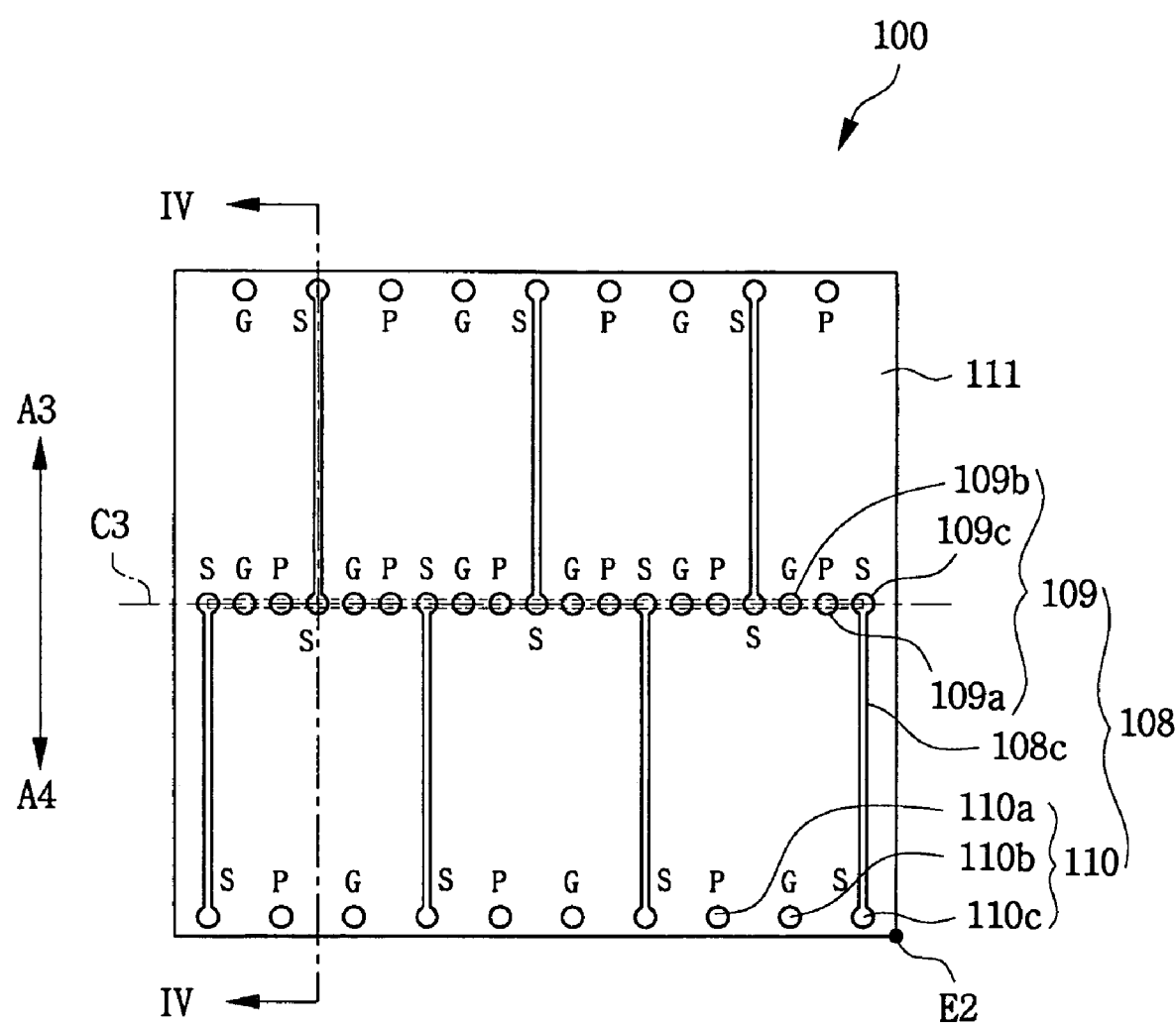
FIG. 5A is a plan view of a rerouting configuration on a third rerouted chip of a multi-chip BGA package in accordance with a second embodiment of the present invention.
Figure 5B:
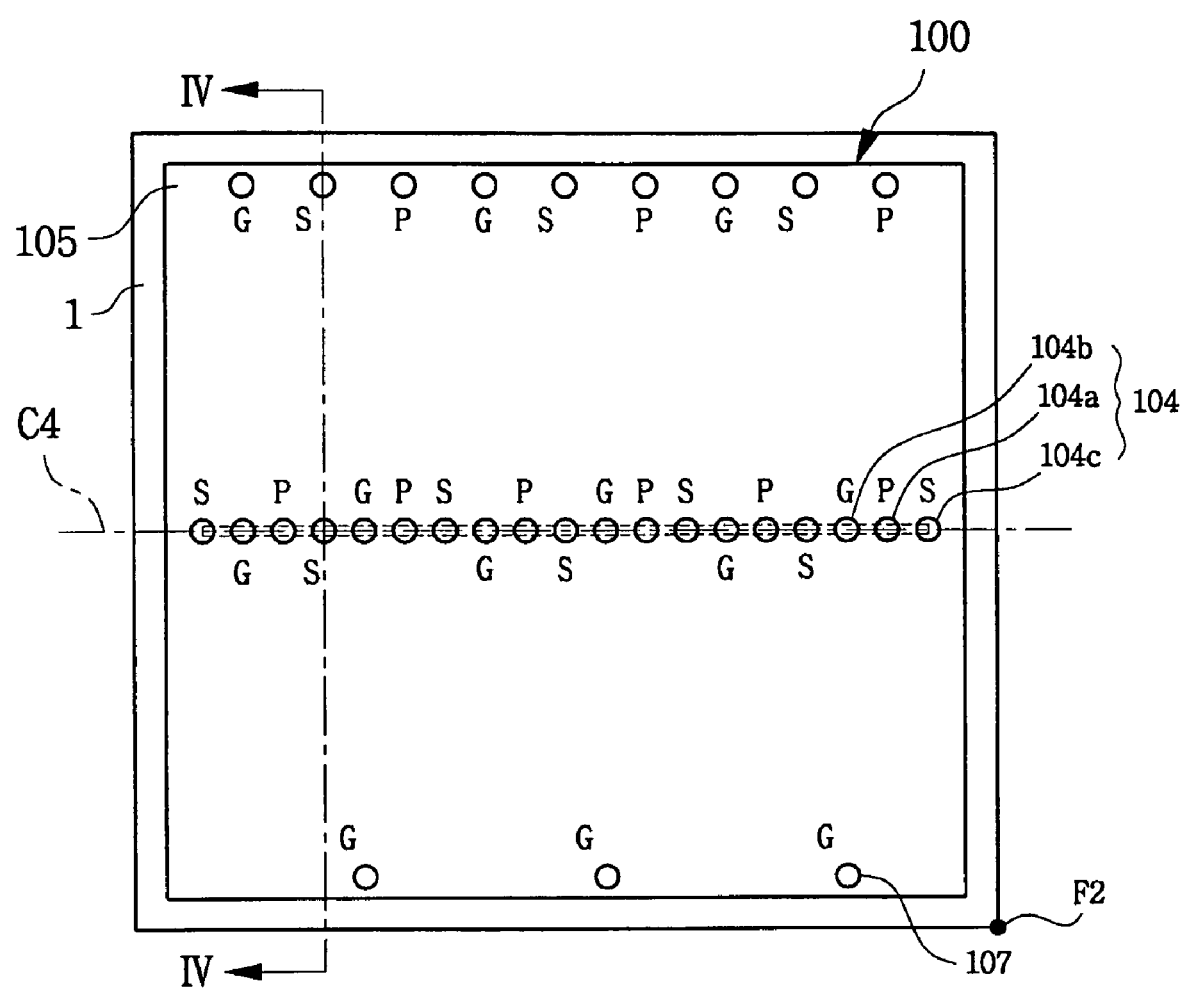
FIG. 5B is a cross-sectional view taken along the line VB—VB of FIG. 4.

FIG. 5A schematically shows, in a top plan view, a rerouting configuration on the third rerouted chip 100 shown in FIG. 4. FIG. 5B is a cross-sectional view taken along the line VB—VB of FIG. 4. FIG. 4 corresponds to a cross-sectional view taken along the line IV—IV of FIGS. 5A and 5B.

Referring to FIG. 5A, the third rerouted chip 100 includes the second rerouting lines 108 and the fourth electrode plate 111. Each of the second rerouting lines 108 comprises the third bump pad 109, second bond pad 110, and second connection line 108c.

The third bump pads 109 include third power bump pads 109a, third ground bump pads 109b, and third signal bump pads 109c. The third bump pads 109 are similar to the aforementioned first bump pads 35 shown in FIG. 3A, so a detailed description about them is omitted.

The second bond pads 110 are regions where the respective bonding wires 3 electrically and physically bond, as shown in FIG. 4. On the third rerouted chip 100, the second bond pads 110 reside along both opposing edges, namely, near end portions in directions of A3 and A4 in FIG. 5A,. The second bond pads 110 include second power bond pads 110a, second ground bond pads 110b, and second signal bond pads 110c, and resemble islands.

The second power bond pads 110a electrically connect with the fourth electrode plate 111. The second ground bond pads 110b electrically connect with the respective corresponding second linking spots 107 shown in FIG. 4. The second signal bond pads 110c electrically connect with the second connection lines 108c.

The second connection lines 108c connect at one end to the third signal bump pad 109c and, at the other end, to the second signal bond pad 110c. That is, the respective second connection lines 108c begin at the central line C3 and extend by turns toward both opposing edges on the third rerouted chip 100.

The fourth electrode plate 111 electrically couples with the third power bump pads 109a, and is in electrical isolation from the third ground bump pads 109b and the third signal bump pads 109c. Therefore, when forming the second rerouting lines 108 and the fourth electrode plate 111, the plating resist should provide electrical connections between the fourth electrode plate 111 and the third power bump pads 109a. Consequently, the fourth electrode plate 111 acts as a power plate. It is desirable to form the fourth electrode plate 111 in a united body with the third power bump pads 109a and the second power bond pads 110a. Therefore, the first bump 5, shown in FIG. 4 and mounted on the third power bump pad 109b, electrically communicates with the fourth electrode plate 111.

Additionally, referring to FIG. 5B, the third rerouted chip 100 includes the first linking spots 104, the third electrode plate 105, and the second linking spots 107.

As shown in FIG. 4, the first linking spots 104 include first power linking spots 104a, first ground linking spots 104b and first signal linking spots 104c, which electrically connect with the power chip pads, ground chip pads and signal chip pads of the third chip pads 102, respectively. The third electrode plate 105 electrically connects with the first ground linking spots 104b, and are in electrical isolation from the first power linking spots 104a and the first signal linking spots 104c. Therefore, when are forming the first linking spots 104 and the third electrode plate 105, the plating resist should provide electrical connections between the third electrode plate 105 and the first ground linking spots 104b. Consequently, the third electrode plate 105 acts as a ground plate. It is desirable to form the third electrode plate 105 in a united body with the first ground linking spots 104b.

The second linking spots 107 are at intervals along both opposing edges on the third rerouted chip 100 and correspond to the respective second ground bond pads 110b. The fourth UBM layer electrically connects the second linking spots 107 formed on the third electrode plate 105.

Additionally, both corners E2 and F2 shown in FIGS. 5A and 5B coincide so that both rerouting configurations of the third rerouted chip 100 correspond, respectively shown in FIGS. 5A and 5B.

As discussed above, the multi-chip BGA package of this embodiment further has a decoupling capacitor in comparison with the first embodiment. It is therefore possible to guarantee decoupling capacitance even if the package of the first embodiment does not have enough decoupling capacitance.

Furthermore, the first rerouting lines 34 in the first embodiment have the first power connection lines 39a, the first ground connection lines 39b and the first signal connection lines 39c as shown in FIG. 3A, whereas the second rerouting lines 108 in this embodiment have the second connection lines 108c only. Therefore, the fourth electrode plate 111 in this embodiment is larger in area than the first electrode plate 37 in the first embodiment. This further improves decoupling capacitance.

The package of this embodiment employs three electrode plates, however, if necessary, it is possible to employ more than three electrode plates. In case of using several plates, one of two adjacent plates should be a power plate and the other should be a ground plate. In this embodiment, the electrode plates are in a stack above the substrate in the following order: the substrate, ground plate, power plate and ground plate, or, the substrate, power plate, ground plate and power plate.

Third Embodiment

Figure 6:
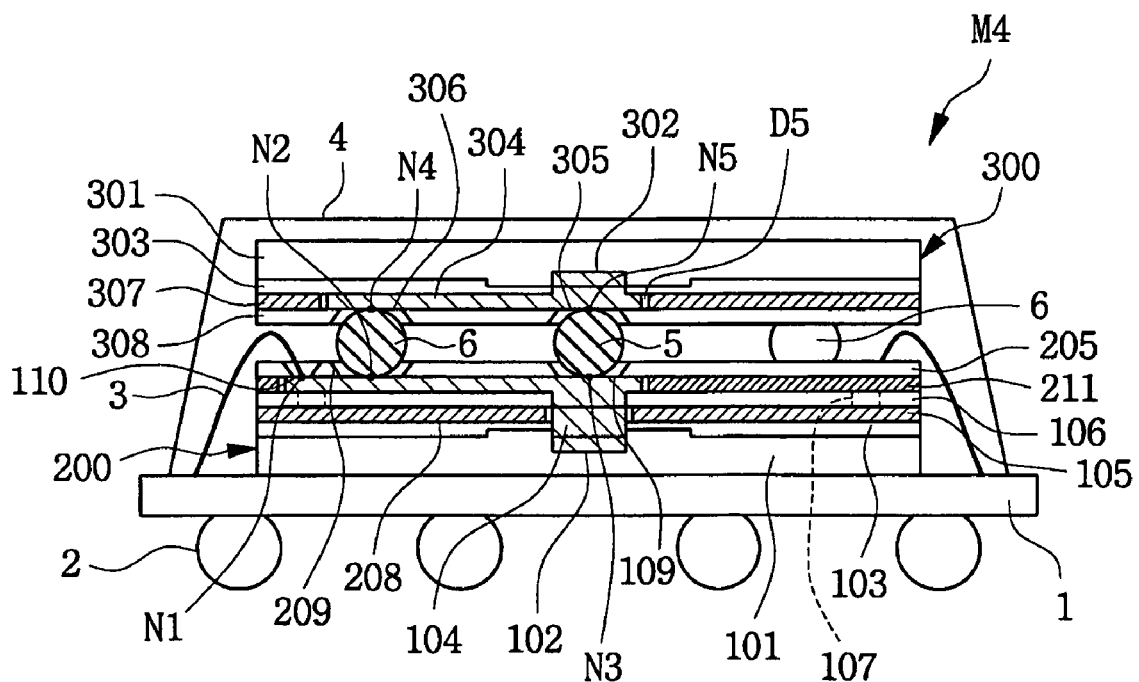
FIG. 6 is a cross-sectional view of a multi-chip BGA package in accordance with a third embodiment of the present invention.

FIG. 6 schematically shows, in a cross-sectional view, a multi-chip BGA package M4 in accordance with a third embodiment of the present invention. In the following descriptions, some elements identical with the elements described earlier in the above first and second embodiments will not be described in detail, using the same reference numerals.

As shown in FIG. 6, the multi-chip BGA package M4 of this embodiment includes fourth and fifth rerouted chips 200 and 300, the first interconnection bumps 5, second interconnection bumps 6, the substrate 1, the conductive balls 2, the bonding wires 3, and the encapsulant 4.

The first interconnection bumps 5, the substrate 1, the conductive balls 2, the bonding wires 3, and the encapsulant 4 are similar to those described in the first embodiment, so detailed descriptions about them are omitted.

The fourth rerouted chip 200 includes third semiconductor chip 101, fifth insulating layer 103, first linking spots 104, third electrode plate 105, sixth insulating layer 106, and second linking spots 107, which are similar to the third rerouted chip of the second embodiment. Unlike the third rerouted chip, the fourth rerouted chip 200 further has third rerouting lines 208, a fifth electrode plate 211, and an eighth insulating layer 205.

The fourth rerouted chip 200 is fabricated as follows.

Process steps from providing the third semiconductor chip 101 to etching the fourth UBM layer are similar to those in the third rerouted chip of the second embodiment. Also, a process step of forming the third rerouting lines 208 and the fifth electrode plate 211 is the same as that of forming the second rerouting lines 108 and the fourth electrode plate 111 in the second embodiment shown in FIG. 4.

The resultant structure may comprise the eighth insulating layer 205. Specifically, to form the eighth insulating layer 205, liquid insulating material coats the third rerouting lines 208 and the fifth electrode plate 211 then undergoes a pre-cure. The pre-cured insulating material is then patterned to create openings exposing the third bump pads 109, fourth bump pads 209 and the second bond pads 110. These exposed parts of the third rerouting lines 208 then undergo a post-curing process.

The fifth rerouted chip 300 has a fifth semiconductor chip 301, fifth chip pads 302, ninth insulating layer 303, fourth rerouting lines 304, sixth electrode plate 307, and tenth insulating layer 308.

The fifth rerouted chip 300 is fabricated as follows.

A well known wafer fabrication process provides the third fifth semiconductor chip 301 containing fifth chip pads 302.

The process then forms the ninth insulating layer 303 on the fifth semiconductor chip 301. Specifically, liquid insulating material coats the passivation layer to a given thickness then pre-cures at a given temperature to form the ninth insulating layer 303. Patterned of the pre-cured insulating material exposes the fifth chip pads 302, before undergoing a post-curing process.

Next, the fabrication process entails forming a fifth UBM layer (not shown) on the ninth insulating layer 303 and the fifth chip pads 302 by a sputtering process.

Next, a plating process forms the fourth rerouting lines 304 and the sixth electrode plate 307 on the fifth UBM layer. For plating, a plating resist coats and the fifth UBM layer. By plating metal such as copper (Cu) or nickel (Ni) within the resist pattern, the fourth rerouting lines 304 and the sixth electrode plate 307 provide a desired pattern.

Next, after removal of the plating resist, an etching process partially removes the fifth UBM layer by using the fourth rerouting lines 304 and the sixth electrode plate 307 as a mask. After etching, the fourth rerouting lines 304 electrically connect with the corresponding fifth chip pads 302 through the fifth UBM layer. Also, the sixth electrode plate 307 electrically connects with ground chip pads among the fifth chip pads 302, as will be seen in detail with reference to FIG. 7B. Particularly, reference character 'D5' indicates the separation of fourth rerouting lines 304 and sixth electrode plate 307.

The resultant structure may comprise the tenth insulating layer 308. Specifically, liquid insulating material coats the fourth rerouting lines 304 and the sixth electrode plate 307, then undergoes pre-curing to form the tenth insulating layer 308. The pre-cured insulating material is then patterned to create openings exposing fifth and sixth bump pads 305 and 306. These exposed parts then undergo a post-curing process.

The second interconnection bumps 6 interpose the corresponding fourth and sixth bump pads 209 and 306 and establish an electrical connection between the third and fourth rerouting lines 208 and 304. Therefore, two bumps 5 and 6 are on an electric signal propagation path extending from a contact point N1, where the bonding wire 3 is bonded to the third rerouting line 208, toward the third chip pad 102. Similarly, two bumps 5 and 6 service the fourth rerouting line 304.

Figure 7A:
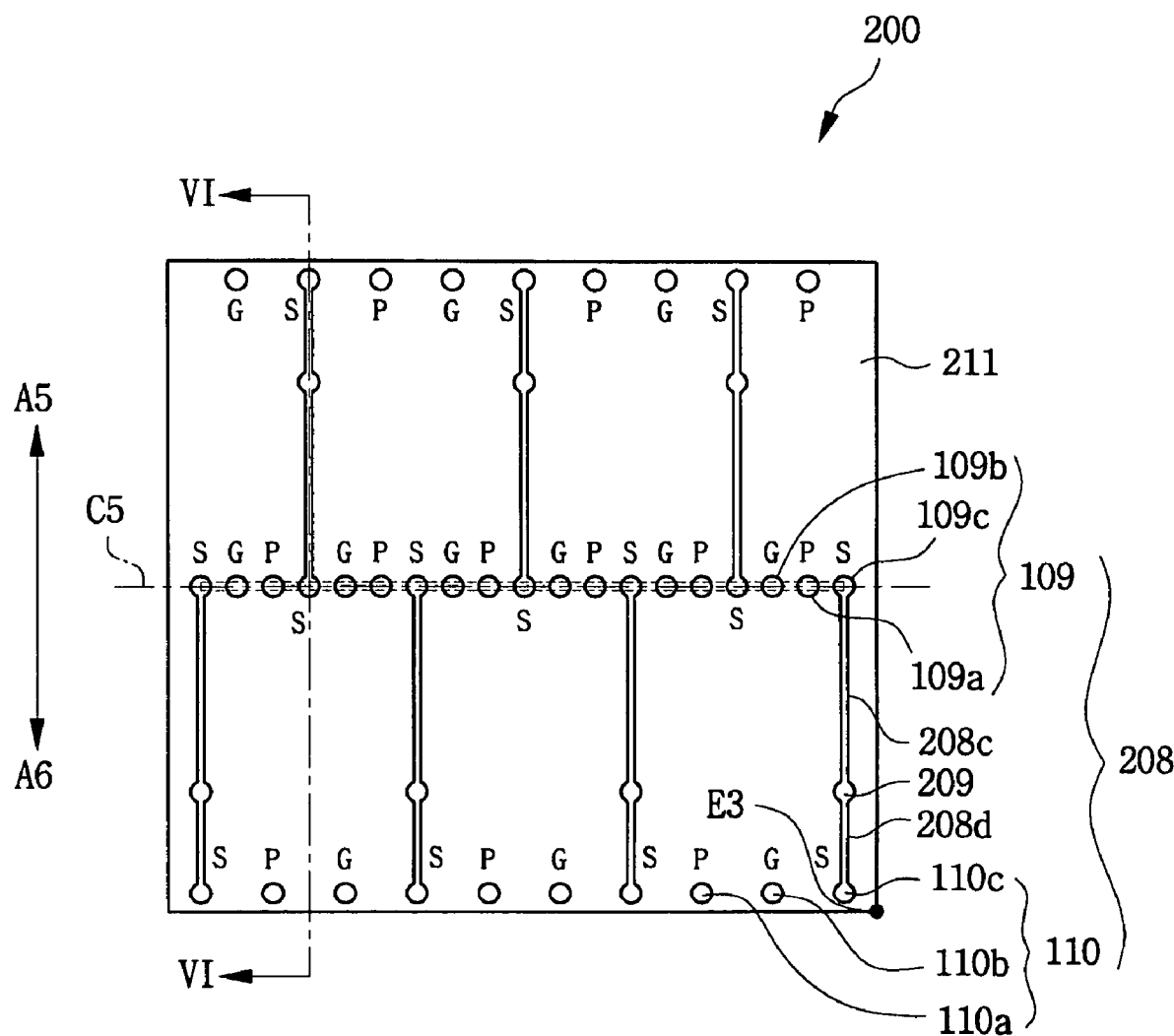
FIG. 7A is a plan view of a rerouting configuration on a fourth rerouted chip of a multi-chip BGA package in accordance with a third embodiment of the present invention.
Figure 7B:
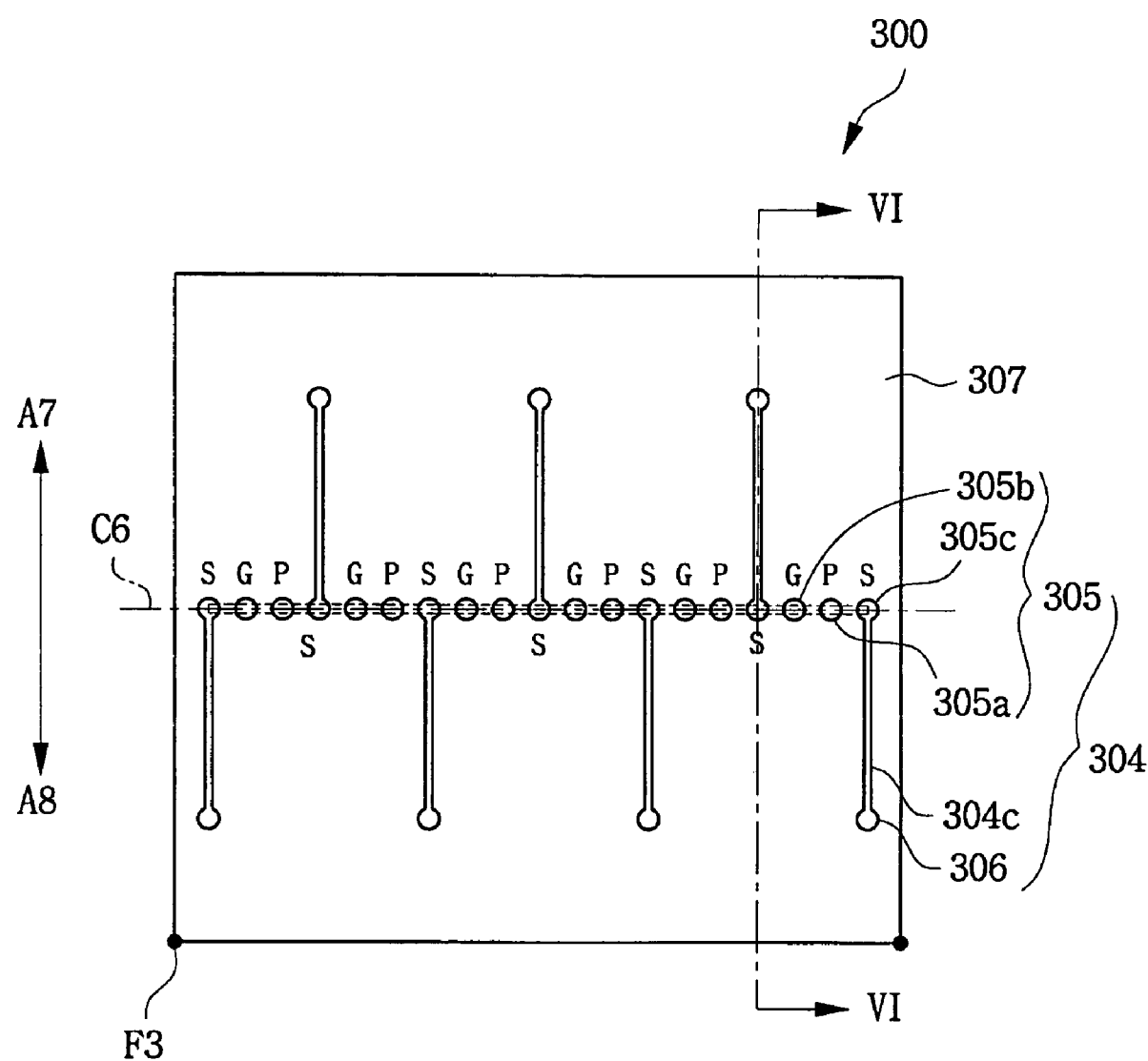
FIG. 7B is a plan view of a rerouting configuration on a fifth rerouted chip of a multi-chip BGA package in accordance with a third embodiment of the present invention.

FIG. 7A schematically shows, in a plan view, a rerouting configuration on the fourth rerouted chip 200 shown in FIG. 6. FIG. 7B schematically shows a rerouting configuration on the fifth rerouted chip 300 shown in FIG. 6. FIG. 6 corresponds to a cross-sectional view taken along the line VI—VI of FIGS. 7A and 7B.

As illustrated in FIG. 7A, the fourth rerouted chip 200 includes the third rerouting lines 208 and the fifth electrode plate 211. Each of the third rerouting lines 208 comprises the third bump pad 109, second bond pad 110, third connection line 208c, fourth connection line 208d, and fourth bump pad 209.

The third bump pad 109 and the second bump pad 110 are similar to those in the third rerouted chip 100 of the second embodiment shown in FIG. 5A.

The third connection line 208c electrically connects, at one end, with the third signal bump pad 109c and, at the other end, with the fourth bump pad 209. That is, the respective third connection lines 208c begin at the central line C5 and extend by turns toward both opposing edges, in directions of A5 and A6, on the fourth rerouted chip 200.

Similarly, the fourth connection line 208d electrically connects, at one end, with the fourth bump pad 209 and, at the other end, with the second signal bond pad 110c.

The fourth bump pad 209 is between and electrically connects with the third signal bump pad 109c and the second signal bond pad 110c. The second bump 6, shown in FIG. 6, mounts on and electrically connects to the fourth bump pad 209.

The fifth electrode plate 211 electrically couples with the third power bump pads 109a, and electrically isolates from both the third ground bump pads 109b and the first signal bump pads 109c. Therefore, when forming the third rerouting lines 208 and the fifth electrode plate 211, the plating resist pattern should provide electrical connections between the fifth electrode plate 211 and the third power bump pads 109a. Consequently, the fifth electrode plate 211 acts as a power plate. Preferably, the fifth electrode plate 211 forms a united body with the third power bump pad 109a and the second power bond pad 110a. Therefore, the first bump 5, shown in FIG. 6, mounts on the third power bump pad 109a, and electrically communicates with the fifth electrode plate 211.

As illustrated in FIG. 7B, the fifth rerouted chip 300 includes the fourth rerouting lines 304 and the sixth electrode plate 307.

Each of the fourth rerouting lines 304 comprises a fifth bump pad 305, sixth bump pad 110, and fifth connection line 304c.

The fifth and sixth bump pads 305 and 306 on the fifth rerouted chip 300 correspond to the aforementioned third and fourth bump pads 109 and 209, respectively, shown in FIG. 7A.

The fifth connection line 304c is on fifth rerouted chip 300 corresponding to the aforementioned third connection line 208c in FIG. 7A. The fifth connection line 304c electrically connects, at one end, with the fifth signal bump pad 305c and, at the other end, to the sixth bump pad 306. The second bump 6, shown in FIG. 6, is on and electrically connects with the sixth bump pad 306. Therefore, the second bump 6 electrically connects the sixth bump pad 306 with the fourth bump pad 209 shown in FIG. 7A.

The sixth electrode plate 307 is similar to the second electrode plate 46, shown in FIG. 3B, except for the fifth connection lines 304c and the sixth bump pads 306, therefore a detailed description is omitted.

Additionally, both corners E3 and F3 shown in FIGS. 7A and 7B coincide with each other so that the rerouting configuration of the fourth rerouted chip 200 and that of the fifth rerouted chip 300 correspond complementarily.

Referring back to FIG. 6, the package M4 of this embodiment further includes fourth bump pads 209, sixth bump pads 306 and second interconnection bumps 6 in comparison with the aforementioned second embodiment. This permits reductions in inductance and resistance from the contact point N1, where the bonding wire 3 is bonded to third rerouting line 208, and third and fifth chip pads 102 and 302.

Figure 8A:
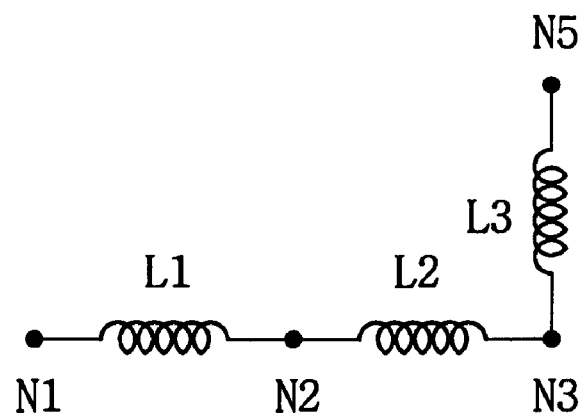
FIG. 8A is a circuit diagram illustrating inductance from a contact point N1 to a contact point N5 of FIG. 6 with a second bump eliminated.
Figure 8B:
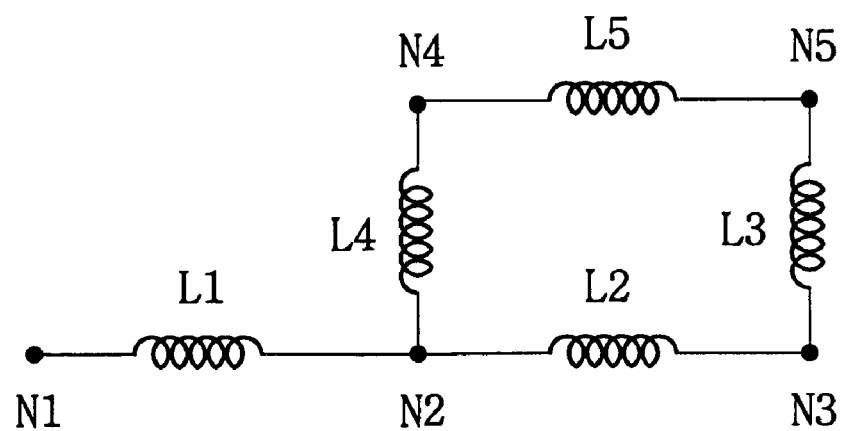
FIG. 8B is a circuit diagram representing inductance from a contact point N1 to a contact point N5 of FIG. 6.

FIG. 8A shows, in a circuit diagram, inductance from the contact point N1 to contact point N5 as shown in FIG. 6, assuming elimination of the second bumps 6. FIG. 8B shows actual inductance from the contact point N1 to the contact point N5 in FIG. 6. Here, L1 is the inductance between the contact points N1 and N2. Similarly, L2 is the inductance between the contact points N2 and N3. L3 is the inductance between the contact points N3 and N5. L4 is the inductance between the contact points N2 and N4. L5 is the inductance between the contact points N4 and N5.

FIG. 8A is similar to the second embodiment in which the first bumps only interpose two opposing rerouted chips. In FIG. 8A, the inductance L10 between the contact points N1 and N3 is given by the formula:

$$L10 = L1 + L2 \qquad (1)$$

Here, the inductance L10 may be equivalent to the inductance of the rerouting line included in the third rerouted chip 100 shown in FIG. 4.

The inductance L20 between the contact points N1 and N5 is given by the formula:

$$L20 = L1 + L2 + L3 \qquad (2)$$

Here, the inductance L20 may be equivalent to the inductance of the rerouting line included in the twentieth rerouted chip 401 shown in FIG. 4.

FIG. 8B corresponds to this embodiment in which the first and second bumps interpose two opposing rerouted chips. In FIG. 8B, the inductance L30 between the contact points N1 and N3 is given by the formula:

$$L30 = L1 + \{L2 \times (L3 + L4 + L5)\}/(L2 + L3 + L4 + L5) \qquad (3)$$

Here, the inductance L30 may be equivalent to the inductance of the rerouting line included in the fourth rerouted chip 200 shown in FIG. 6.

The inductance L40 between the contact points N1 and N5 is given by the formula:

$$L40 = L1 + (L2 + L3) \times (L4 + L5)/(L2 + L3 + L4 + L5) \qquad (4)$$

Here, the inductance L40 may be equivalent to the inductance of the rerouting line included in the fifth rerouted chip 300 shown in FIG. 6.

Assuming the third and fourth rerouting lines 208 and 304, shown in FIG. 6, have the same material and shape, the inductance L5 becomes equal to the inductance L2. Also, the inductance of first and second bumps 5 and 6, shown in FIG. 6, is much smaller than the inductance between the contact points N2 and N3, so the inductances L3 and L4 can be neglected. As a result, the aforementioned inductances L20, L30 and L40 can be changed to L21, L31 and L41 as follows:

$$L21 = L1 + L2 \qquad (5)$$

$$L31 = L1 + L2/2 \qquad (6)$$

$$L41 = L1 + L2/2 \qquad (7)$$

From the formulae 1 and 6, the inductance L31 is smaller than the inductance L10. Further, from the formulae 5 and 7, the inductance L41 is smaller than the inductance L21. It is therefore evident that the rerouting configuration of this embodiment reduces inductance. The same applies to resistance.

By reason of the above, the multi-chip BGA package of this embodiment can diminish a stub phenomenon between a pair of rerouted chips and also realize a device capable of high-speed signal input/output.

The above-described reduction in inductance is much more effective when applied to the power or ground lines. A detailed description regarding this will be given in the fourth embodiment.

The package of the current embodiment employs decoupling capacitors comprising the third, fifth and sixth electrode plates 105, 211 and 307 as depicted in FIG. 6. However, even if such decoupling capacitors are not included, those skilled in the art will understand the package characteristics may improve by additionally employing the fourth and sixth bump pads 209 and 306 and the second interconnection bumps 6.

Moreover, the third and fourth connection lines 208c and 208d, shown in FIG. 7A, and the fifth connection lines 304, shown in FIG. 7B, can become the coplanar waveguide described before in the first embodiment. Also, since the third rerouting lines 208 having the third and fourth connection lines 208c and 208d are disposed above the third electrode plate 105 as shown in FIG. 6, the third and fourth connection lines 208c and 208d can become a conductor backed coplanar waveguide. Therefore, effectively dissipating heat generated from the third and fourth connection lines 208c and 208d.

Fourth Embodiment

Figure 9A:
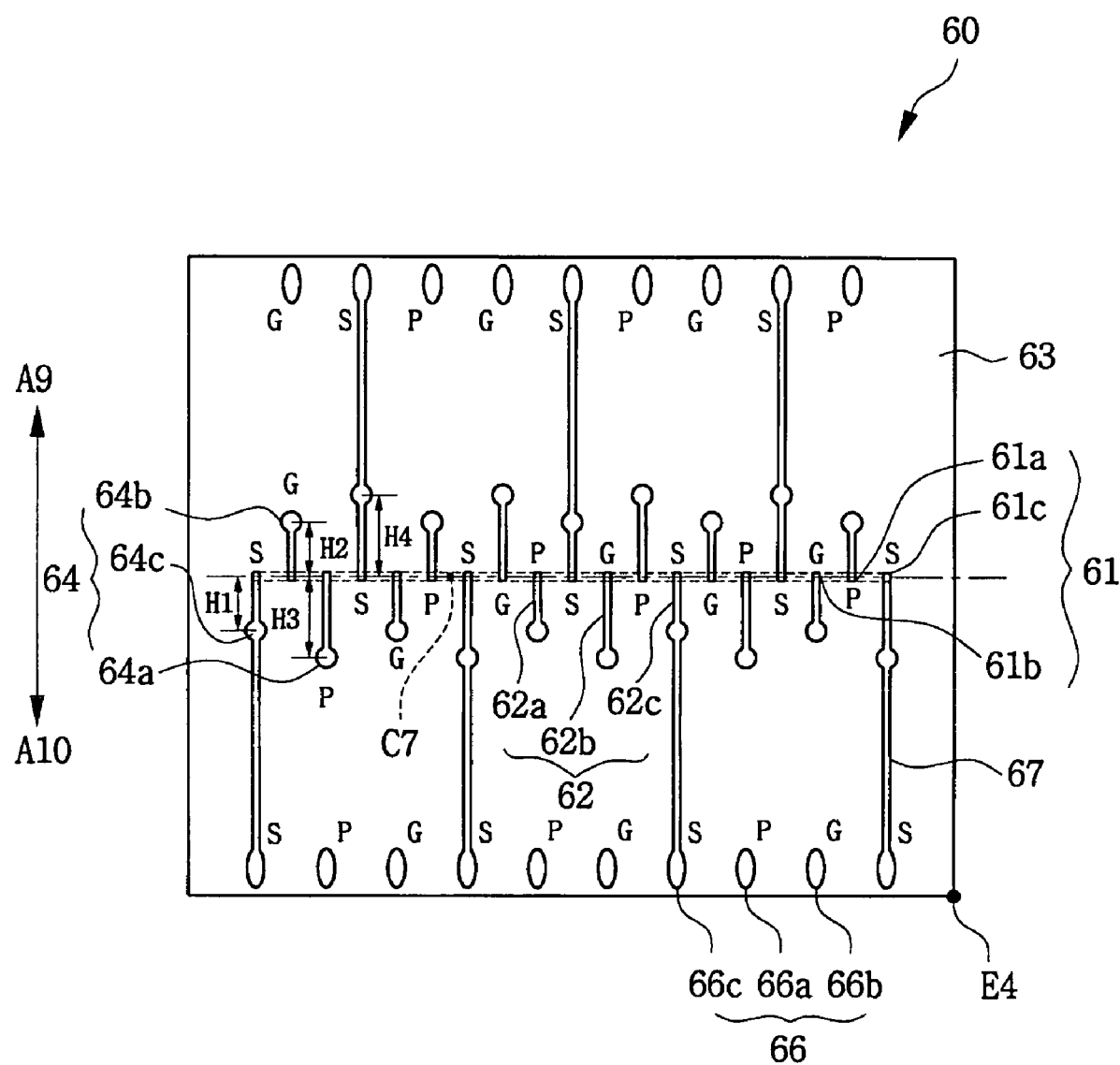
FIG. 9A is a plan view of a rerouting configuration on a sixth rerouted chip of a multi-chip BGA package in accordance with a fourth embodiment of the present invention.
Figure 9B:
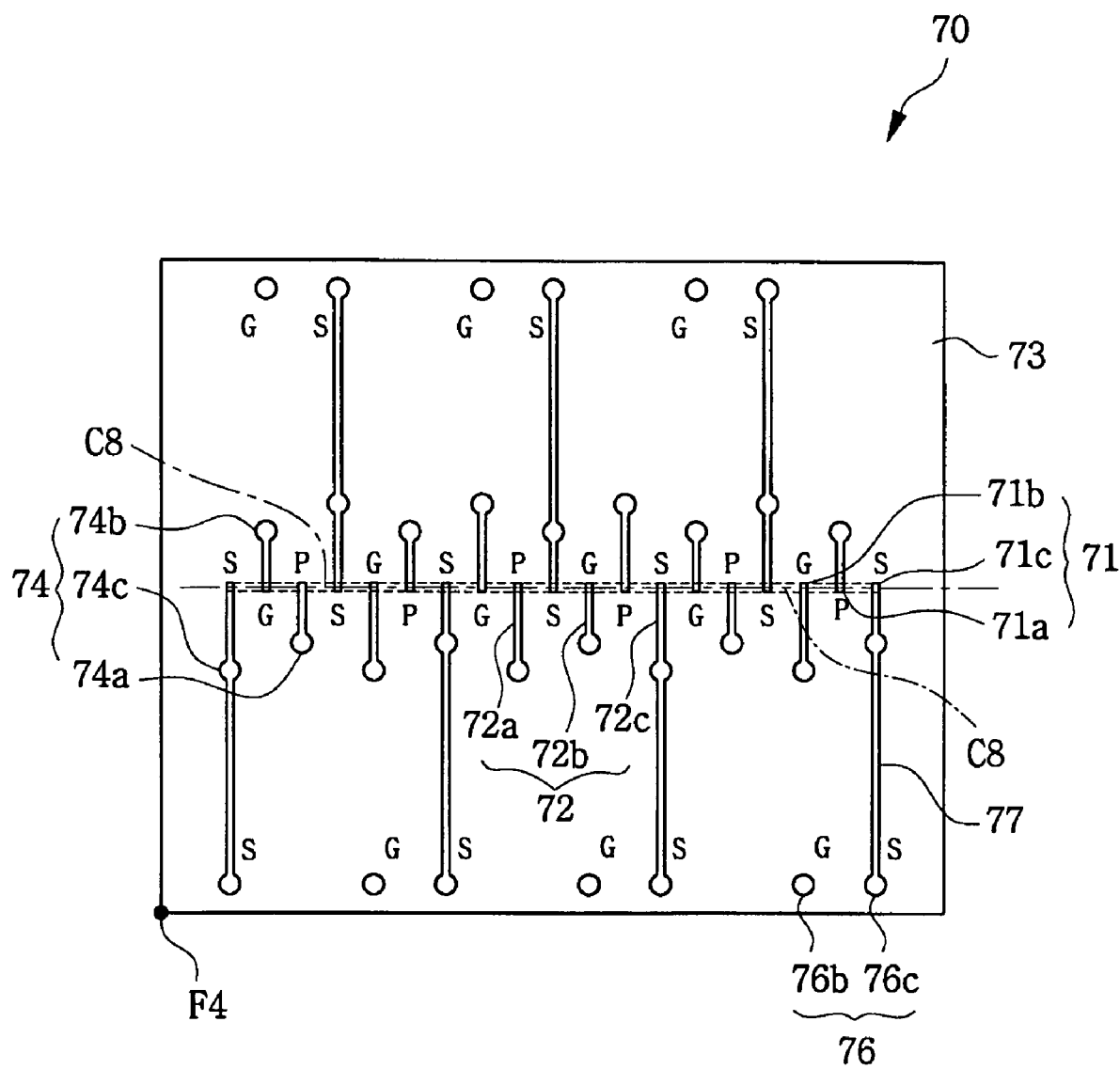
FIG. 9B is a plan view of a rerouting configuration on a seventh rerouted chip of a multi-chip BGA package in accordance with a fourth embodiment of the present invention.

FIG. 9A schematically shows, in a plan view, a rerouting configuration on a sixth rerouted chip 60 of a multi-chip BGA package in accordance with a fourth embodiment of the present invention. FIG. 9B schematically shows, in a plan view, a rerouting configuration on a seventh rerouted chip 70 of a multi-chip BGA package in accordance with a fourth embodiment of the present invention.

In the descriptions about this embodiment, some elements described in the above embodiments will not be described here in detail.

Further, the following descriptions focus on changes in rerouting configuration, in comparison with the aforementioned third embodiment. Also, insignificant changes dependent on changes in the rerouting configuration will not be described in detail.

As shown in FIG. 9A, the sixth rerouted chip 60 includes a sixth semiconductor chip (not shown), first center pads 61, sixth connection lines 62, seventh connection lines 67, seventh bump pads 64, first large pads 66, and a seventh electrode plate 63. The sixth semiconductor chip is similar to third semiconductor chip 101, shown in FIG. 6.

The first center pads 61 are in a row along a central line C7 on the sixth rerouted chip 60. The first center pads 61 have first power center pads 61a, first ground center pads 61b, and first signal center pads 61c.

The first power center pads 61a electrically connect with respective sixth power chip pads (not shown) of the sixth semiconductor chip and also with an external power terminal (not shown). Similarly, the first ground center pads 61b electrically connect with respective sixth ground chip pads (not shown) of the sixth semiconductor chip and with an external ground terminal (not shown). Similarly, the first signal center pads 61c electrically connect with respective sixth signal chip pads (not shown) of the sixth semiconductor chip and with an external signal terminal (not shown).

The sixth connection lines 62 have sixth power connection lines 62a, sixth ground connection lines 62b, and sixth signal connection lines 62c.

The sixth power connection line 62a electrically connects with, at one end, the first power center pad 61a and, at the other end, seventh power bump pad 64a. Similarly, the sixth ground connection line 62b electrically connects with, at one end, the first ground center pad 61b and, at the other end, to seventh ground bump pad 64b.

Each of the seventh connection lines 67 electrically connect with, at one end, seventh signal bump pad 64c and, at the other end, first signal large pad 66c.

The seventh bump pads 64 comprise the seventh power bump pads 64a, the seventh ground bump pads 64b, and seventh signal bump pads 64c. The first interconnection bumps 5, exemplarily shown in FIG. 6, are mounted on and electrically connected to the respective seventh bump pads 64.

The seventh power bump pads 64a electrically connect with the respective sixth power connection lines 62a. Similarly, the seventh ground bump pads 64b electrically connect with the respective sixth ground connection lines 62b. The seventh signal bump pads 64c are between and electrically connect the sixth signal connection lines 62c and the seventh connection lines 67.

The respective seventh bump pads 64 are at unequal distances, namely, H1, H2, H3 and H4, from the central line C7 on the sixth rerouted chip 60, so the respective sixth connection lines 62 connected thereto are different in length.

The first large pads 66 have first power large pads 66a, first ground large pads 66b, and the first signal large pads 66c. Each of the first large pads 66 is a composite pad combining the function of the fourth bump pad 209 and the second signal bond pad 110c, shown in FIG. 7A. Therefore, the first large pads 66 join to the second interconnection bumps 6 as well as the bonding wires 3 shown in FIG. 6. Preferably, the first large pad 66 has an oval shape for proper functioning.

The first power large pads 66a are at intervals along both opposing edges on the sixth rerouted chip 60 and electrically connect with the seventh electrode plate 63. It is therefore desirable that the first power large pad 66a forms in a united body with the seventh electrode plate 63. The first ground large pads 66b and the first signal large pads 66c are also at intervals along opposing edges on the sixth rerouted chip 60. The first signal large pads 66c electrically connect with the respective seventh signal lines 67.

The seventh electrode plate 63 is slightly different in shape from the aforementioned fifth electrode plate 211 shown in FIG. 7A, but very similar in function. Therefore, a detailed description regarding the seventh electrode plate 63 is omitted.

Referring to FIG. 9B, the seventh rerouted chip 70 includes a seventh semiconductor chip (not shown), second center pads 71, eighth connection lines 72, ninth connection lines 77, eighth bump pads 74, ninth bump pads 76, and an eighth electrode plate 73. The seventh semiconductor chip is similar to the fifth semiconductor chip 301, shown in FIG. 6.

The second center pads 71 have second power center pads 71a, second ground center pads 71b, and second signal center pads 71c. The second center pads 71 electrically connect with respective corresponding chip pads (not shown) of the seventh semiconductor chip. The second center pads 71 are in a row along a central line C8 on the seventh rerouted chip 70, corresponding to the aforementioned first center pads 61 shown in FIG. 9A, respectively.

The eighth connection lines 72 have eighth power connection lines 72a, eighth ground connection lines 72b, and eighth signal connection lines 72c, which are on the seventh rerouted chip 70 corresponding to the aforementioned sixth connection lines 62 shown in FIG. 9A, respectively.

Also, the ninth connection lines 77 are on the seventh rerouted chip 70 corresponding to the aforementioned seventh connection lines 67 shown in FIG. 9A, respectively.

The eighth bump pads 74 comprise eighth power bump pads 74a, eighth ground bump pads 74b, and eighth signal bump pads 74c. The eighth bump pads 74 are also on the seventh rerouted chip 70 corresponding to the aforementioned seventh bump pads 64 shown in FIG. 9A, respectively. The first interconnection bumps 5, exemplarily shown in FIG. 6, physically join and electrically connect the respective eighth bump pads 74. Therefore, the eighth bump pads 74 electrically communicate with the seventh bump pads 64 through the first bumps 5.

The ninth bump pads 76 have ninth ground bump pads 76b and ninth signal bump pads 76c, which are on the seventh rerouted chip 70 corresponding to the first ground large pads 66b and the first signal large pads 66c, as shown in FIG. 9A, respectively. The second interconnection bumps 6 shown in FIG. 6 physically join and electrically connect the respective ninth bump pads 76. Therefore, the ninth bump pads 76 electrically communicate with the aforementioned first large pads 66, shown in FIG. 9A, through the second bumps 6.

The eighth electrode plate 73 slightly differs in shape from the aforementioned sixth electrode plate 53 shown in FIG. 7B, but is very similar in function. Therefore, a detailed description about that is omitted.

In the final form of the package, a corner F4 of the seventh rerouted chip 70 coincides with a corner E4 of the sixth rerouted chip 60 shown in FIG. 9A so that the rerouting configurations of both chips 70 and 60 correspond.

To improve process stability and to shorten process time, the rerouting configurations of both chips 70 and 60 may be symmetric with each other.

As earlier discussed in FIG. 6, the third embodiment provides the second interconnection bumps 6 applied to the signal lines only. However, according to this embodiment, it is also possible to apply the second bumps 6 to the ground lines as well as the signal lines. Therefore, considerably reducing the inductance of electric paths. Like this embodiment, the second bumps may apply to the power lines.

Particularly, as shown in FIGS. 9A and 9B, this embodiment provides the seventh and eighth bump pads 64 and 74 staggered along the central lines C7 and C8. Consequently, the first interconnection bumps, mounted on the above bump pads, are also staggered. This allows a dense and fine-pitch arrangement of the first bumps in comparison with a straight arrangement. Therefore, the rerouting configuration of this embodiment can contribute to reductions in chip size and package size without falling off in performance.

Fifth Embodiment

Figure 10A:
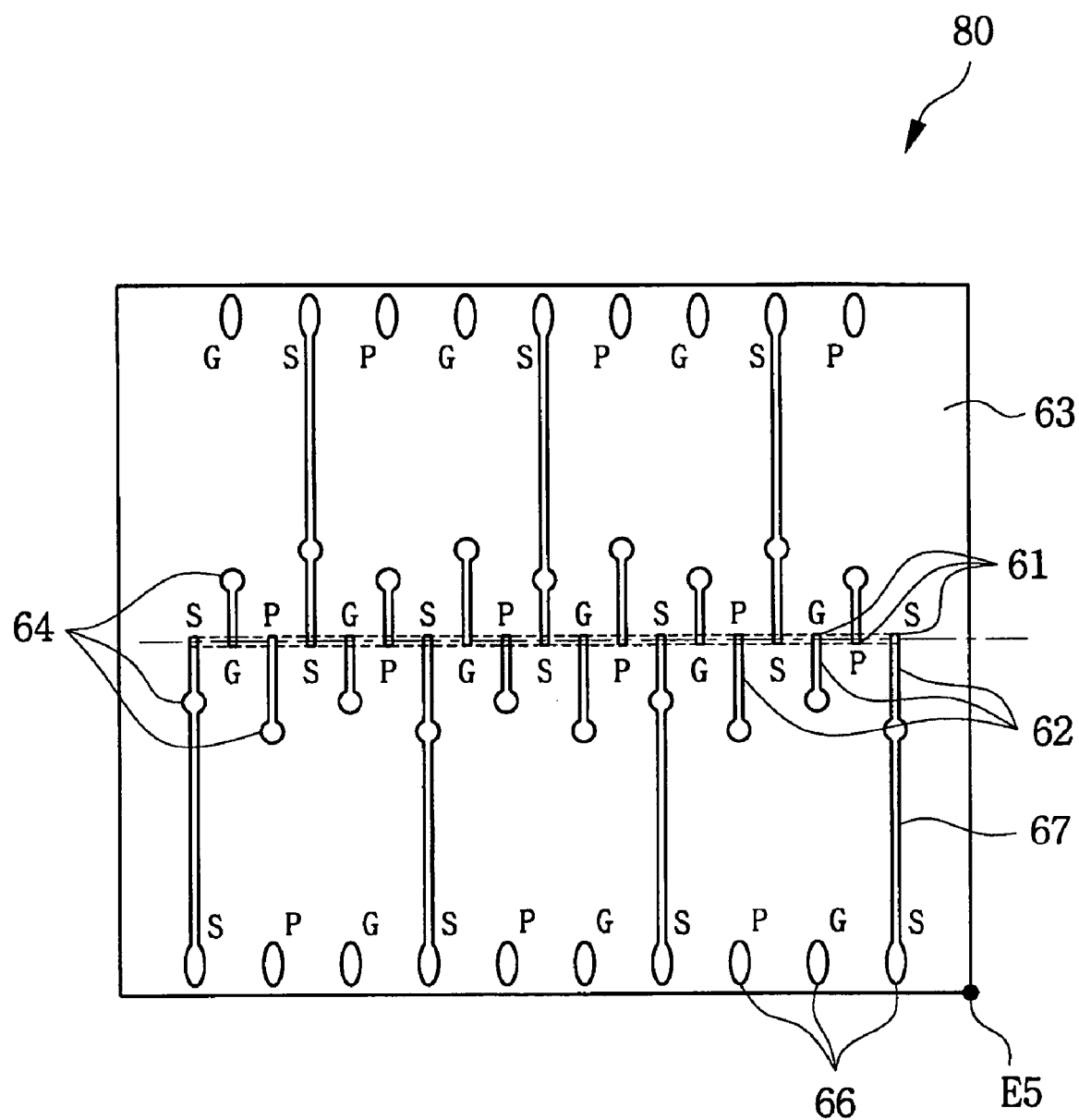
FIG. 10A is a plan view of a rerouting configuration on an eighth rerouted chip of a multi-chip BGA package in accordance with a fifth embodiment of the present invention.
Figure 10B:
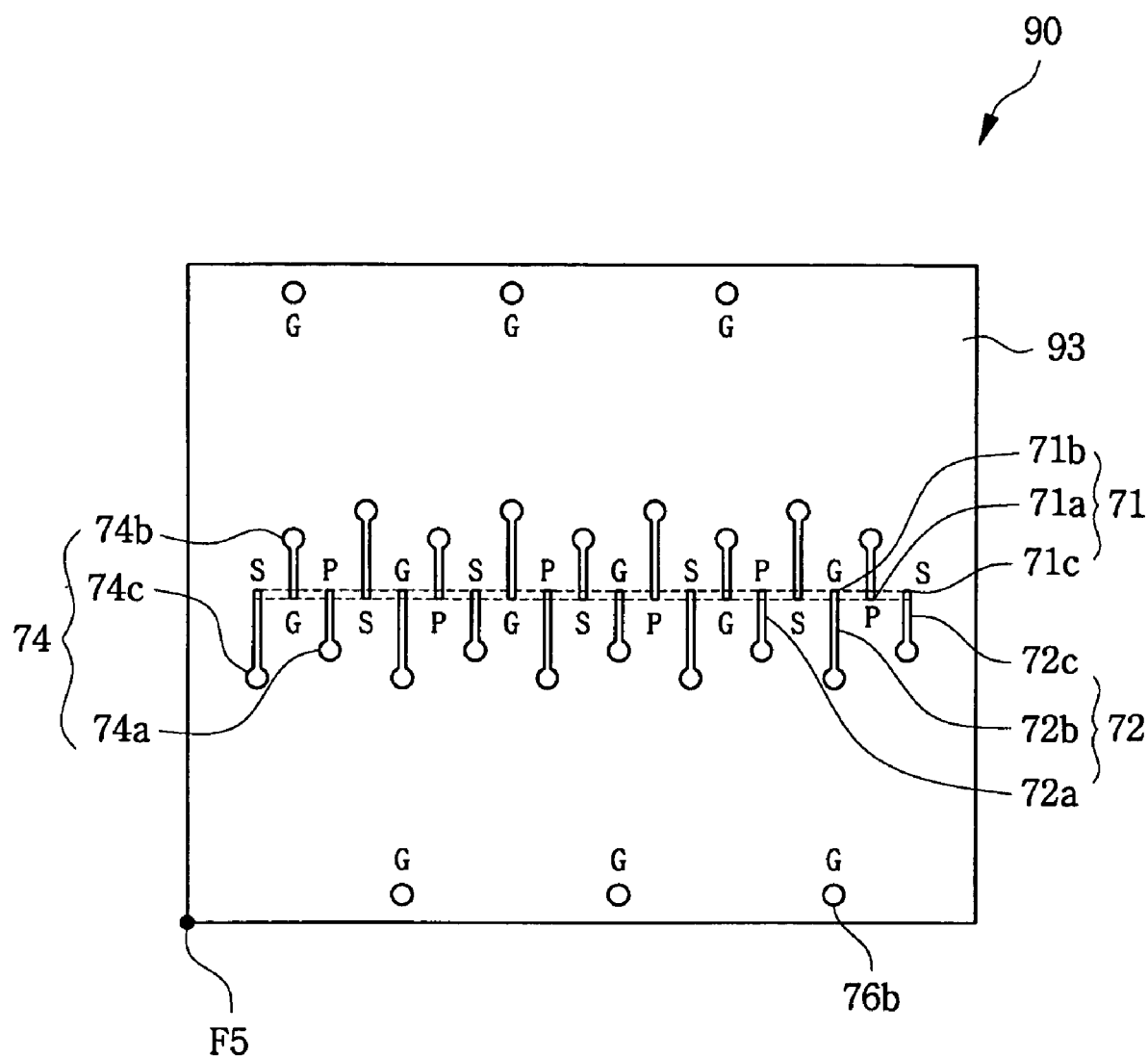
FIG. 10B is a plan view of a rerouting configuration on a ninth rerouted chip of a multi-chip BGA package in accordance with a fifth embodiment of the present invention.

FIG. 10A schematically shows, in a plan view, a rerouting configuration on an eighth rerouted chip 80 of a multi-chip BGA package in accordance with a fifth embodiment of the present invention. FIG. 10B schematically shows, in a plan view, a rerouting configuration on a ninth rerouted chip 90 of a multi-chip BGA package in accordance with a fifth embodiment of the present invention.

In the descriptions of this embodiment, some elements described above in the previous embodiments will not be described in detail, and will use the same reference numerals.

Further, the following descriptions will focus on changes in rerouting configuration in comparison with the aforementioned fourth embodiment. Therefore, insignificant changes dependent on changes in the rerouting configuration will not be described in detail.

The eighth rerouted chip 80, shown in FIG. 10A, is the substantially same as the sixth rerouted chip 60, shown in FIG. 9A, described before in the fourth embodiment. So, a description thereof is omitted. Referring to FIG. 10B, the ninth rerouted chip 90 includes the second center pads 71, the eighth connection lines 72, the eighth bump pads 74, the ninth ground bump pads 76b, and a ninth electrode plate 93.

The second center pads 71, eighth connection lines 72, eighth bump pads 74, and ninth ground bump pads 76b are similar to the fourth embodiment, so detailed descriptions about them are omitted. Also, the ninth electrode plate 93 is slightly different in shape from the eighth electrode plate 73 shown in FIG. 9B and described before in the fourth embodiment, but very similar in function. Therefore, related descriptions are omitted.

In the final form of the package, a corner E5 of the eighth rerouted chip 80, shown in FIG. 10A, coincides with a corner F5 of the ninth rerouted chip 90, shown in FIG. 10B, so that the rerouting configurations of both chips 80 and 90 correspond.

Sixth Embodiment

Figure 11A:
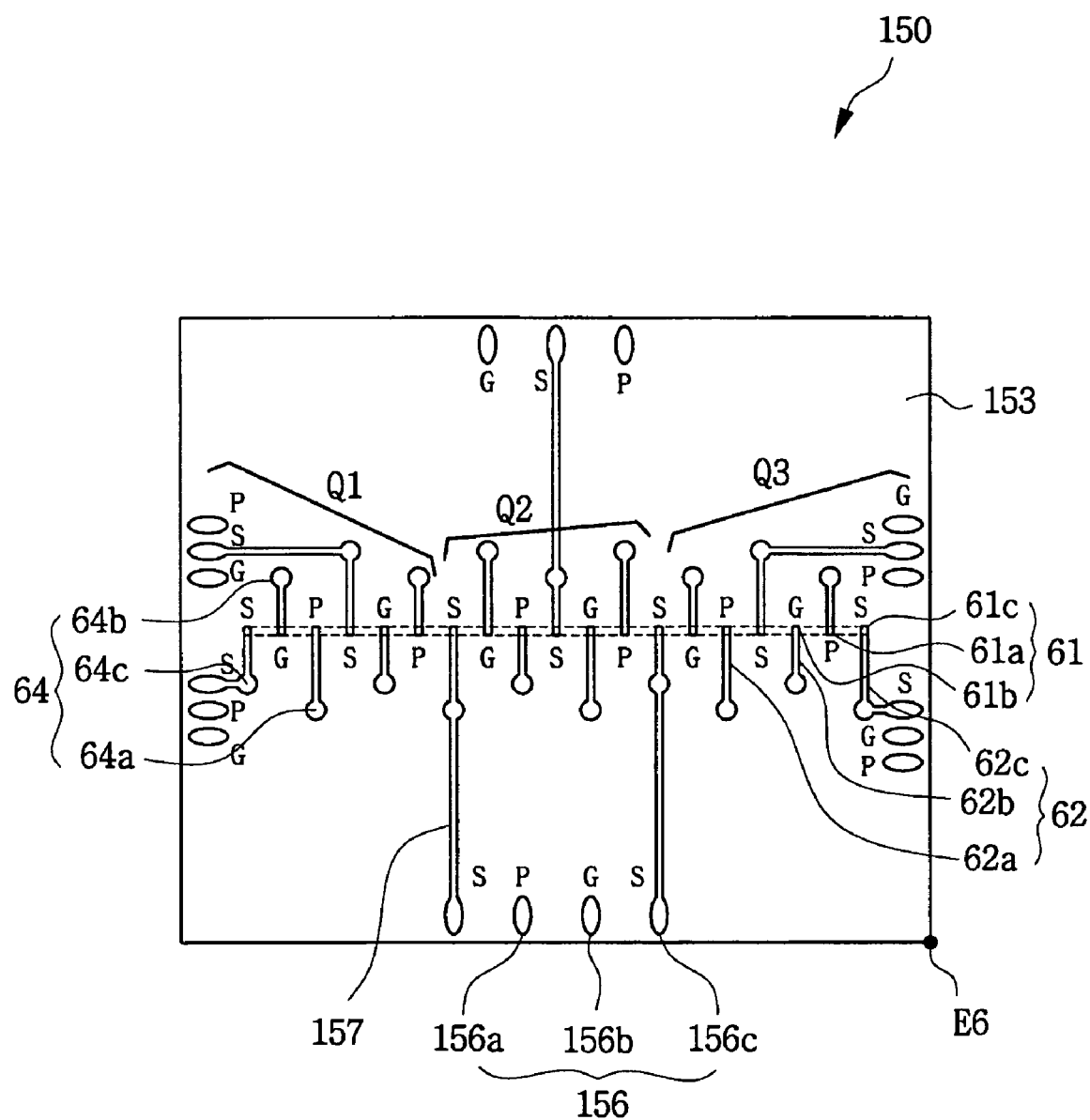
FIG. 11A is a plan view of a rerouting configuration on a tenth rerouted chip of a multi-chip BGA package in accordance with a sixth embodiment of the present invention.
Figure 11B:
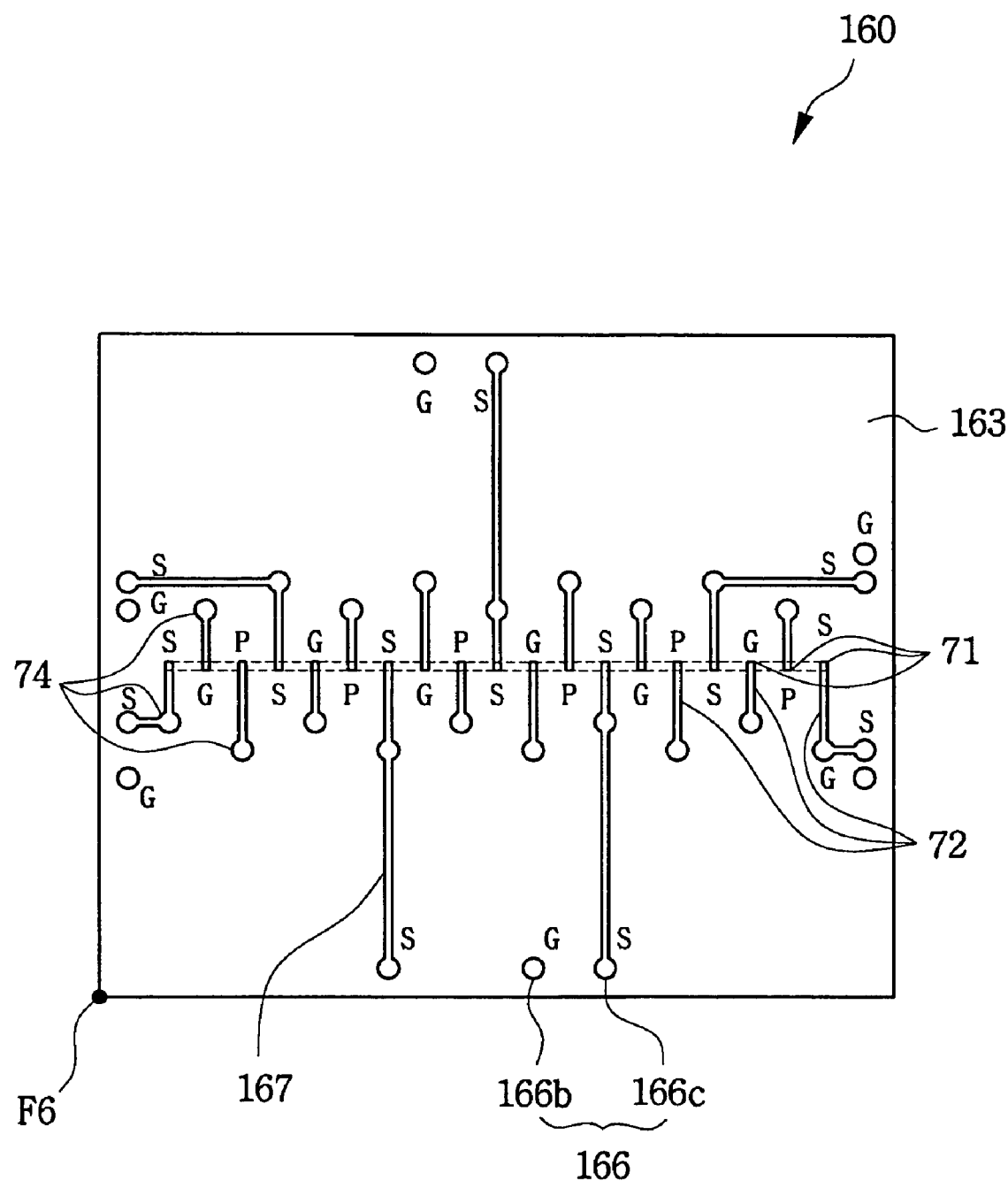
FIG. 11B is a plan view of a rerouting configuration on an eleventh rerouted chip of a multi-chip BGA package in accordance with a sixth embodiment of the present invention.

FIG. 11A schematically shows, in a plan view, a rerouting configuration on a tenth rerouted chip 150 of a multi-chip BGA package in accordance with a sixth embodiment of the present invention. FIG. 11B schematically shows, in a plan view, a rerouting configuration on an eleventh rerouted chip 160 of a multi-chip BGA package in accordance with a sixth embodiment of the present invention.

In the descriptions about this embodiment, some elements described above in previous embodiments will not be described in detail, and will use the same reference numerals.

Further, the following descriptions will focus on changes in rerouting configuration in comparison with the fourth embodiment. Also, insignificant changes dependent on changes in the rerouting configuration will not be described in detail.

As shown in FIG. 11A, the tenth rerouted chip 150 includes the first center pads 61, second large pads 156, the sixth connection lines 62, the seventh bump pads 64, tenth connection lines 157, and a tenth electrode plate 153.

The first center pads 61, sixth connection lines 62, and seventh bump pads 64 are similar to those described in the fourth embodiment, so detailed descriptions about them are omitted. Also, the tenth electrode plate 153 is slightly different in shape from the seventh electrode plate 63 shown in FIG. 9A and described before in the fourth embodiment, but very similar in function. Therefore, related descriptions are omitted.

The second large pads 156 have second power large pads 156a, second ground large pads 156b, and second signal large pads 156c. The second large pads 156 are near four edges on the tenth rerouted chip 150. Specifically, each second large pad 156 is at the nearest edge to the corresponding center pad 61. For example, in FIG. 1A, one group of the second large pads 61, denoted by Q1, is toward a left edge. Also, another group denoted by Q2 is toward an upper or a lower edge, and the other group denoted by Q3 is toward a right edge.

Each of the tenth connection lines 157 electrically connects, at one end, with the seventh signal bump pad 64c and, at the other end, with seventh signal large pad 156c.

Figure 1:
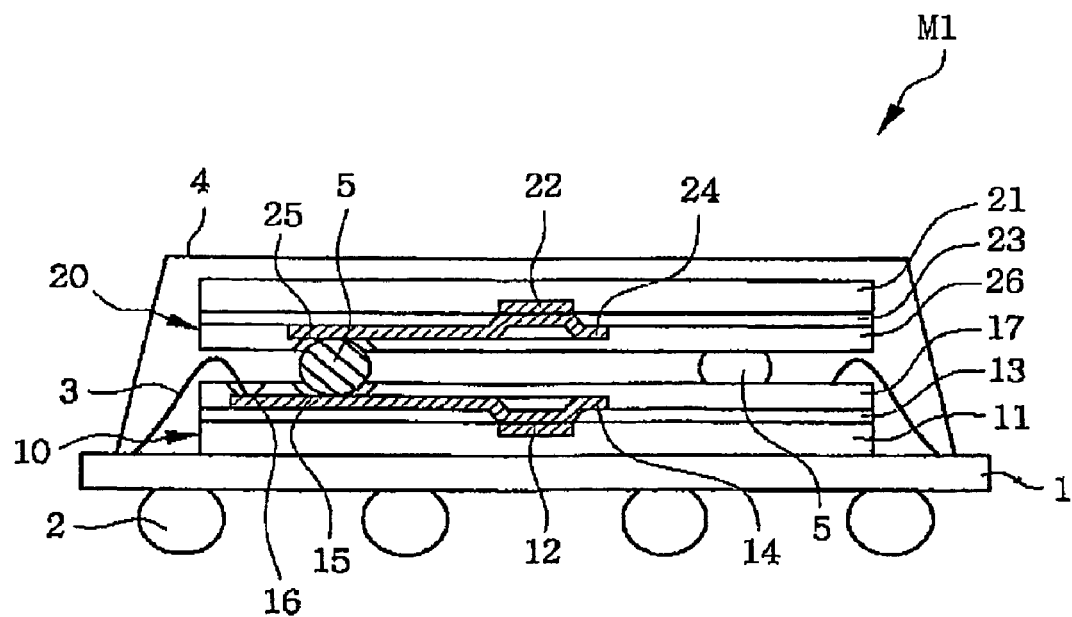
FIG. 1 is a cross-sectional view of a conventional multi-chip BGA package.

On the other hand, referring to FIG. 1 B, the eleventh rerouted chip 160 includes second center pads 71, eighth connection lines 72, eleventh connection lines 167, eighth bump pads 74, tenth bump pads 166, and an eleventh electrode plate 163.

The second center pads 71, eighth connection lines 72, and eighth bump pads 74 are similar to that described in the fourth embodiment, obviating the need for detailed descriptions. Also, the eleventh electrode plate 163 slightly differs in shape from the eighth electrode plate 73 shown in FIG. 9B and described in the fourth embodiment, but is very similar in function. So, related descriptions are omitted.

The eleventh connection lines 167 form on the eleventh rerouted chip 160, corresponding to the tenth connection lines 157 shown in FIG. 11A.

The tenth bump pads 166 have tenth ground bump pads 166b and tenth signal bump pads 166c, which also form on the eleventh rerouted chip 160 corresponding to the second ground large pads 156b and the second signal large pads 156c, described and shown in FIG. 11A, respectively.

In the final form of the package, a corner F6 of the eleventh rerouted chip 160 coincides with a corner E6 of the tenth rerouted chip 150 shown in FIG. 11A so that the rerouting configurations of both chips 150 and 160 correspond.

To improve process stability and to shorten process time, the rerouting configurations of both chips 150 and 160 may be symmetric.

As discussed, the current embodiment provides the second large pads 156, shown in FIG. 11A, and the corresponding tenth bump pads 166, shown in FIG. 11B. As also discussed, the above pads 156 and 166 are near four edges on the respective rerouted chip 150 and 160. Therefore, the second interconnection bumps 6, shown in FIG. 6 interpose the above pads 156 and 166, likewise they are near four edges on the respective rerouted chip 150 and 160.

Since the second bumps 6 support the upper rerouted chip, namely, the eleventh chip 160, in the final package form, four-edge arrangement allows a more reliable stack of the upper rerouted chip. Further, a four-edge arrangement shortens the signal lines belonging in groups Q1 and Q3, reducing the inductance and the resistance of the signal lines.

Seventh Embodiment

Figure 12A:
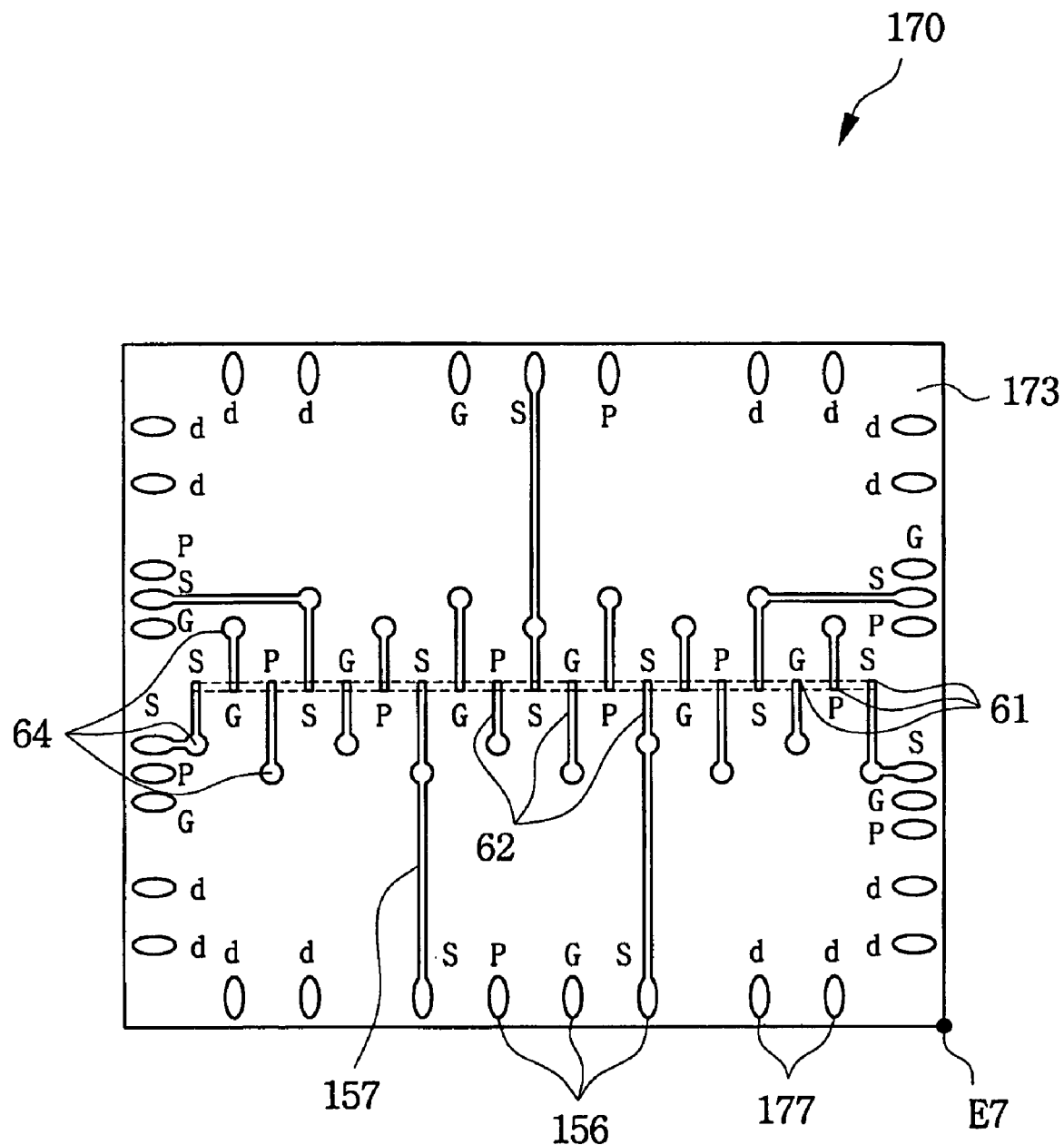
FIG. 12A is a plan view of a rerouting configuration on a twelfth rerouted chip of a multi-chip BGA package in accordance with a seventh embodiment of the present invention.
Figure 12B:
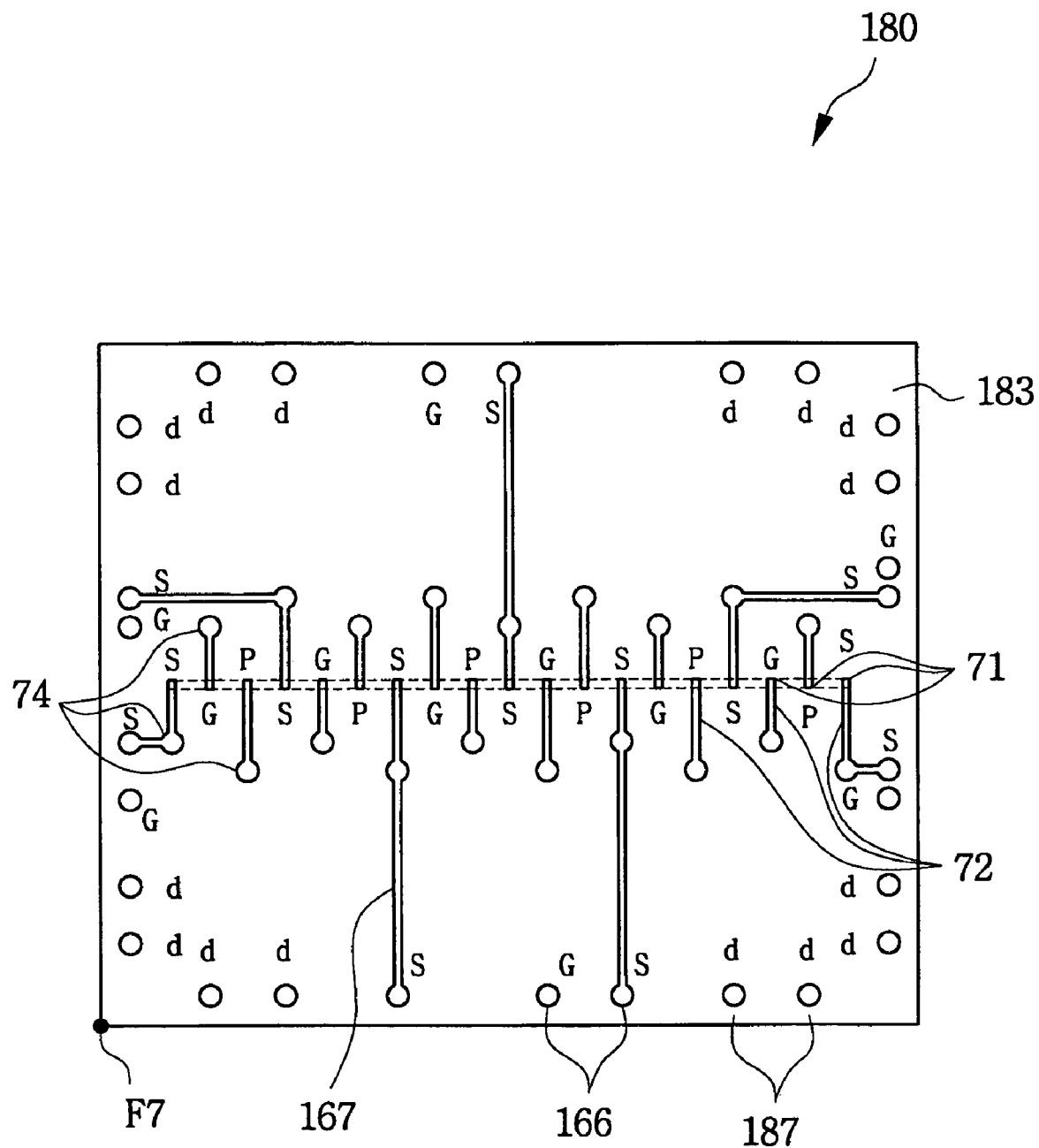
FIG. 12B is a plan view of a rerouting configuration on a thirteenth rerouted chip of a multi-chip BGA package in accordance with a seventh embodiment of the present invention.

FIG. 12A schematically shows, in a plan view, a rerouting configuration on a twelfth rerouted chip 170 of a multi-chip BGA package in accordance with a seventh embodiment of the present invention. FIG. 12B schematically shows, in a plan view, a rerouting configuration on a thirteenth rerouted chip 180 of a multi-chip BGA package in accordance with a seventh embodiment of the present invention.

In the descriptions of this embodiment, some elements identical with the elements described above in the previous embodiments will not be described in detail, and will use the same reference numerals.

Further, the following descriptions will focus on changes in rerouting configuration in comparison with the sixth embodiment. Also, insignificant changes dependent on changes in the rerouting configuration will not be described in detail.

As shown in FIG. 12A, the twelfth rerouted chip 170 includes first center pads 61, second large pads 156, sixth connection lines 62, tenth connection lines 157, seventh bump pads 64, a twelfth electrode plate 173, and first dummy pads 177. In FIG. 12A, a reference letter 'd' refers to a dummy pad.

The first center pads 61, second large pads 156, sixth connection lines 62, tenth connection lines 157, and seventh bump pads 64 are similar to those described in the sixth embodiment, so detailed descriptions about them are omitted. Also, the twelfth electrode plate 173 is slightly different in shape from the tenth electrode plate 153 shown in FIG. 11A and described in the sixth embodiment, but very similar in function. Therefore, related descriptions are omitted.

The first dummy pads 177 are along four edges on the twelfth rerouted chip 170. For example, as shown, two first dummy pads 177 form toward each end of every edge. The first dummy pads 177 are separate and electrically isolated from the twelfth electrode plate 173 by separating spaces as mentioned above. The respective first dummy pads 177 support dummy balls (not shown) mounted and joined thereto.

On the other hand, referring to FIG. 12B, the thirteenth rerouted chip 180 includes second center pads 71, eighth connection lines 72, eleventh connection lines 167, eighth bump pads 74, tenth bump pads 166, thirteenth electrode plate 183, and second dummy pads 187.

The second center pads 71, eighth connection lines 72, eleventh connection lines 167, eighth bump pads 74, and tenth bump pads 166 are similar to those described in the sixth embodiment, so detailed descriptions are omitted. Also, the thirteenth electrode plate 183 slightly differs in shape from the eleventh electrode plate 163 shown in FIG. 11B and described in the sixth embodiment, but is very similar in function. Therefore, related descriptions are omitted.

The second dummy pads 187 form on the thirteenth rerouted chip 180, corresponding to the first dummy pads 177 shown in FIG. 12A. The second dummy pads 187 are separate and electrically isolated from the thirteenth electrode plate 183 by separating spaces. The aforementioned dummy balls on the first dummy pads 177 also join with the second dummy pads 187. Therefore, the dummy balls support the upper rerouted chip, namely, the thirteenth chip 180, in the final package form.

In the final form of the package, a corner F7 of the thirteenth rerouted chip 180 coincides with a corner E7 of the twelfth rerouted chip 170 shown in FIG. 12A so that the rerouting configurations of both chips 170 and 180 correspond.

To improve process stability and to shorten process time, the rerouting configurations of both chips 170 and 180 may be symmetric with each other.

As discussed, the current embodiment provides the first and second dummy pads 177 and 187, allowing more reliable stacking of the upper rerouted chip.

Eighth Embodiment

Figure 13:
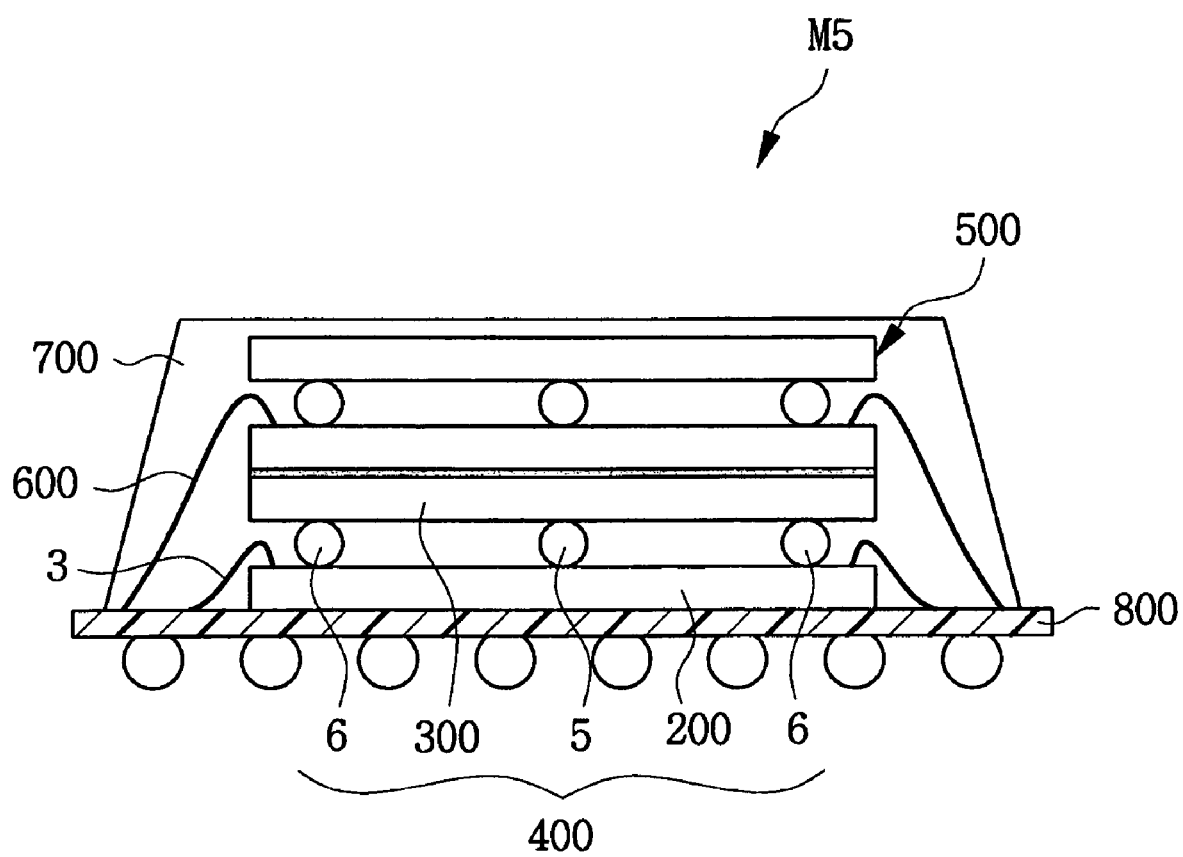
FIG. 13 is a cross-sectional view of a multi-chip BGA package in accordance with an eighth embodiment of the present invention.

FIG. 13 schematically shows, in a cross-sectional view, a multi-chip BGA package M5 in accordance with an eighth embodiment of the present invention.

In the descriptions about this embodiment, some elements identical with the elements described in the previous embodiments will not be described in detail and will use the same reference numerals.

Particularly, the following descriptions will focus on changes in stacking structure of the rerouted chips in comparison with the third embodiment shown in FIG. 6. Also, insignificant changes from changes in stacking structure will not be described in detail.

As shown in FIG. 13, the multi-chip BGA package M5 according to this embodiment includes first multi-chip 400, second multi-chip 500, substrate 800, bonding wires 3, second bonding wires 600, second encapsulant 700, and conductive balls 900.

The first multi-chip 400 comprises the fourth and fifth rerouted chips 200 and 300, and the first and second bumps 5 and 6, which are described in the third embodiment and shown in FIG. 6.

The second multi-chip 500 is similar to and may be identical to structure in the first multi-chip 400. The bottom surface of the second multi-chip 500 fixes on the top surface of the first multi-chip 400 by an adhesive.

The substrate 800 fixedly supports the bottom surface of the first multi-chip 400. The conductive balls 900 arrange on the bottom surface of the substrate 800 and electrically connect the package M5 to external electronics.

The bonding wires 3 electrically connect the fourth rerouted chip 200 of the first multi-chip 400 to the substrate 800. Similarly, the second bonding wires 600 electrically connect the second multi-chip 500 to the substrate 800. The second encapsulant 700 forms on the top surface of the substrate 800 and covers the first and second multi-chips 400 and 500 and the bonding wires 3 and 600.

As discussed, this embodiment further provides the second multi-chip 500, is increasing the number of the semiconductor chips per unit area of the substrate 800.

As fully described, the multi-chip BGA packages according to the present invention have at least the following advantages.

First, the rerouted chips may include electrode plates coplanar with the rerouting lines and acting as decoupling capacitors. This structural feature allows a reduction in simultaneous switching noise generated in the rerouted chips due to fluctuation in power voltage, without causing an increase in thickness of the package. Therefore, the rerouted chips improve operating speed and reduce logic fault, and increase stable operation.

Furthermore, a reduction in simultaneous switching noise of the rerouted chips controls the occurrence of electromagnetic waves. Therefore, considerably improving stability.

Moreover, each pair of rerouting lines on upper and lower rerouted chips may include two or more interconnection bumps. This reduces inductance and resistance along electric signal propagation paths. Therefore, the rerouted chips improve signal propagation.

In conclusion, the multi-chip BGA packages of the present invention can realize small, thin, high-speed and high-density memory devices.

While this invention has been particularly shown and described with reference to preferred embodiments thereof, those skilled in the art will understand various changes in form and details may be made without departing from the spirit and scope of the invention as defined by the appended claims.

What is claimed is:

1. A multi-chip package comprising:
a first semiconductor chip coupled with a first electrode plate;
a second semiconductor chip coupled with a second electrode plate, the first electrode plate and the second electrode plate arranged to provide a decoupling capacitor between the first semiconductor chip and the second semiconductor chip; and
first rerouting lines coupled with the first semiconductor chip, wherein the first semiconductor chip, first electrode plate, and the first rerouting lines constitute part of a first rerouted chip.

2. The multi-chip package of claim 1, wherein the package is a Ball Grid Array (BGA) package.

3. The multi-chip package of claim 1, wherein the first semiconductor chip further comprises first chip pads.

4. The multi-chip package of claim 3, wherein the first chip pads include first power chip pads.

5. The multi-chip package of claim 3 wherein the first chip pads include first ground chip pads.

6. The multi-chip package of claim 3, wherein the first rerouting lines are on the first semiconductor chip and electrically connect with the first chip pads.

7. The multi-chip package of claim 6, wherein the first electrode plate is on the first semiconductor chip and electrically connects with the first chip pads.

8. The multi-chip package of claim 7, further comprising second rerouting lines coupled with the second semiconductor chip, wherein the second semiconductor chip, second electrode plate, and second rerouting lines constitute part of a second rerouted chip.

9. The multi-chip package of claim 8, wherein the second semiconductor chip further comprises second chip pads electrically connecting with first chip pads.

10. The multi-chip package of claim 9, wherein the first electrode plate connects with first power chip pads and the second electrode plate connects with second ground chip pads.

11. The multi-chip package of claim 9, wherein the first electrode plate connects with first ground chip pads and the second electrode plate connects with second power chip pads.

12. The multi-chip package of claim 9, further comprising a plurality of first interconnection bumps to electrically connect the first rerouting lines and the second rerouting lines.

13. The multi-chip package of claim 12, further comprising a substrate to fixedly support the first rerouted chip.

14. The multi-chip package of claim 13, further comprising a plurality of bonding wires to electrically connect the first rerouting lines with the substrate.

15. The multi-chip package of claim 14, further comprising a plurality of conductive balls arranged under the substrate to electrically connect the substrate to electronics.

16. The multi-chip package of claim 15, wherein the first rerouted chip further includes a first insulating layer on the first semiconductor chip, the first insulating layer comprising the first electrode plate.

17. The multi-chip package of claim 16, wherein the first insulating layer has first openings, the first electrode plate to communicate with the first chip pads through the first openings.

18. The multi-chip package of claim 17, wherein the first electrode plate is coplanar with the first rerouting lines.

19. The multi-chip package of claim 18, wherein the first electrode plate has first slots.

20. The multi-chip package of claim 19, wherein the first rerouting lines are within the first slots.

21. The multi-chip package of claim 20, wherein the first rerouting lines have a coplanar waveguide to control impedance.

22. The multi-chip package of claim 21 wherein the impedance is controlled according to a ratio of a width of the first rerouting line to a width of the first slot.

23. The multi-chip package of claim 15, wherein the second rerouted chip further includes a second insulating layer on the second semiconductor chip, the second insulating layer comprising the second electrode plate.

24. The multi-chip package of claim 23, wherein the second insulating layer has second openings, the second electrode plate to communicate with the second chip pads through the second openings.

25. The multi-chip package of claim 15, wherein the second electrode plate is coplanar with the second rerouting lines.

26. The multi-chip package of claim 25, wherein the second electrode plate has second slots.

27. The multi-chip package of claim 26, wherein the second rerouting lines are disposed within the second slots.

28. The multi-chip package of claim 27, wherein the second rerouting lines have a coplanar waveguide to control impedance.

29. The multi-chip package of claim 28 wherein the impedance is controlled according to a ratio of a width of the second rerouting line to a width of the second slot.

30. The multi-chip package of claim 15, wherein the first rerouted chip further includes a third electrode plate opposite the second electrode plate with respect to the first electrode plate, to electrically connect with the first chip pads.

31. The multi-chip package of claim 15, wherein the second rerouted chip further includes a fourth electrode plate opposite the first electrode plate with respect to the second electrode plate, to electrically connect with the second chip pads.

32. The multi-chip package of claim 15, further comprising:
   a plurality of second interconnection bumps to electrically connect the first rerouting lines and the second rerouting lines, the plurality of second interconnection bumps adjacent to and spaced from the first interconnection bumps.

33. A multi-chip package comprising:
   a first rerouted chip including a first semiconductor chip with first chip pads, and first rerouting lines on the first semiconductor chip to electrically connect with the first chip pads, each first rerouting line having a first bump pad, a third bump pad, and a bond pad;
   a second rerouted chip facing the first rerouted chip including a second semiconductor chip having second chip pads, and second rerouting lines disposed on the second semiconductor chip to electrically connect with the second chip pads, each second rerouting line having a second bump pad and a fourth bump pad;
   a plurality of first interconnection bumps between and electrically connecting the first bump pad and the second bump pad;
   a plurality of second interconnection bumps between and electrically connecting the third bump pad and the fourth bump pad;
   a substrate fixedly supporting the first rerouted chip;
   a plurality of bonding wires disposed on the respective bond pads to electrically connect the first rerouting lines with the substrate; and
   a plurality of conductive balls under the substrate to electrically connect the substrate to electronics.

34. The multi-chip BGA package of claim 33, further comprising:
   a plurality of dummy balls between the first rerouted chip and the second rerouted chip.

* * * * *